(12) United States Patent
Hung et al.

(10) Patent No.: US 12,322,469 B2
(45) Date of Patent: Jun. 3, 2025

(54) MANAGING PAGE BUFFER CIRCUITS IN MEMORY DEVICES

(71) Applicant: Macronix International Co., Ltd., Hsinchu (TW)

(72) Inventors: Ji-Yu Hung, Toufen (TW); E-Yuan Chang, Chiayi (TW)

(73) Assignee: Macronix International Co., Ltd., Hsinchu (TW)

( * ) Notice: Subject to any disclaimer, the term of this patent is extended or adjusted under 35 U.S.C. 154(b) by 160 days.

(21) Appl. No.: 18/150,584

(22) Filed: Jan. 5, 2023

(65) Prior Publication Data

US 2024/0233783 A1   Jul. 11, 2024

(51) Int. Cl.
*G11C 7/00* (2006.01)
*G11C 7/10* (2006.01)

(52) U.S. Cl.
CPC .......... *G11C 7/1048* (2013.01); *G11C 7/1084* (2013.01); *G11C 7/1087* (2013.01)

(58) Field of Classification Search
CPC .................................................... G11C 7/1051
USPC .................................................... 365/189.05
See application file for complete search history.

(56) References Cited

U.S. PATENT DOCUMENTS

| 2006/0221739 A1* | 10/2006 | Kim ........................ G11C 16/24 |
| | | 365/203 |
| 2007/0030735 A1 | 2/2007 | Crippa et al. |
| 2009/0196102 A1 | 8/2009 | Kim |
| 2013/0286746 A1* | 10/2013 | Choi .................. G11C 16/3454 |
| | | 365/185.22 |
| 2014/0380116 A1* | 12/2014 | Hirano .................. G11C 29/78 |
| | | 714/758 |
| 2021/0233574 A1* | 7/2021 | Cho ...................... G11C 7/1057 |
| 2022/0020404 A1 | 1/2022 | Cho et al. |
| 2022/0366964 A1 | 11/2022 | Kang et al. |
| 2022/0406342 A1 | 12/2022 | Lu et al. |

FOREIGN PATENT DOCUMENTS

| EP | 3 955 254 A1 | 2/2022 |
| JP | H10-144086 A | 5/1998 |
| JP | H11-176185 A | 7/1999 |
| JP | 2016-167331 A | 9/2016 |
| TW | 202113819 A | 4/2021 |
| TW | 202242880 | 11/2022 |

* cited by examiner

*Primary Examiner* — Hoai V Ho
(74) *Attorney, Agent, or Firm* — Fish & Richardson P.C.

(57) ABSTRACT

Systems, methods, circuits, and apparatus for managing page buffer circuits in memory devices are provided. In one aspect, a memory device includes a memory cell array, a page buffer circuit including a plurality of page buffers, and a cache data latch (CDL) circuit including a plurality of caches coupled to the plurality of page buffers through a plurality of data bus sections. The plurality of data bus sections are configured to be conductively connected together as a data bus for data transfer. Each data bus section corresponds to a page buffer in the page buffer circuit and is configured to conductively separate from at least one adjacent data bus section for data sensing in the memory cell array.

20 Claims, 19 Drawing Sheets

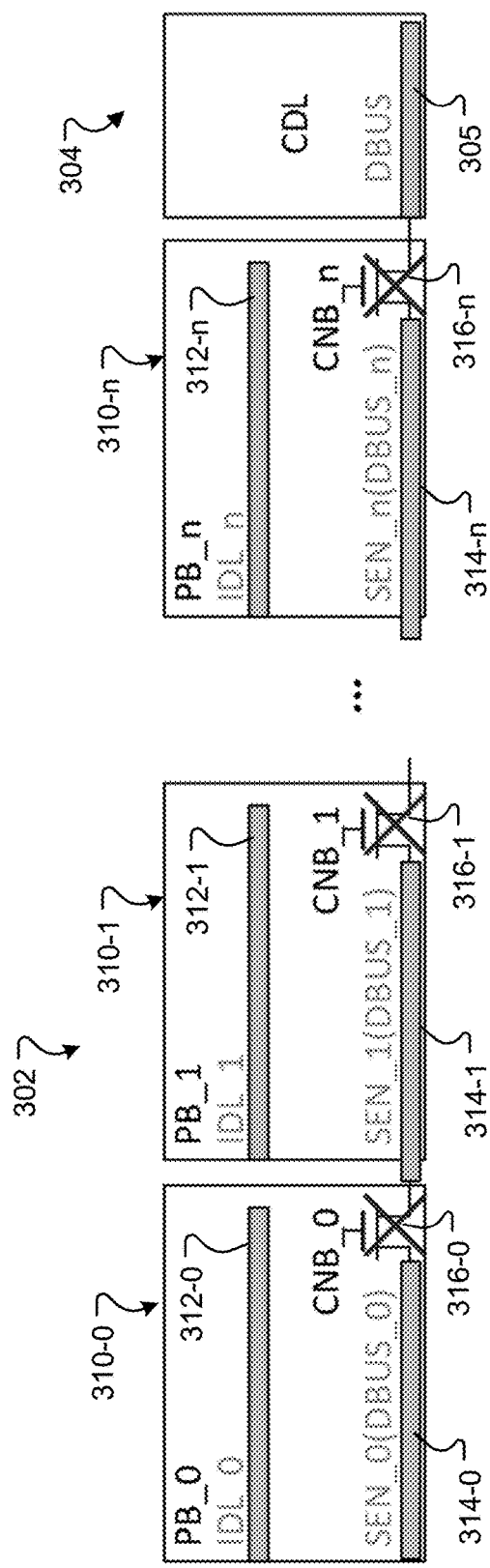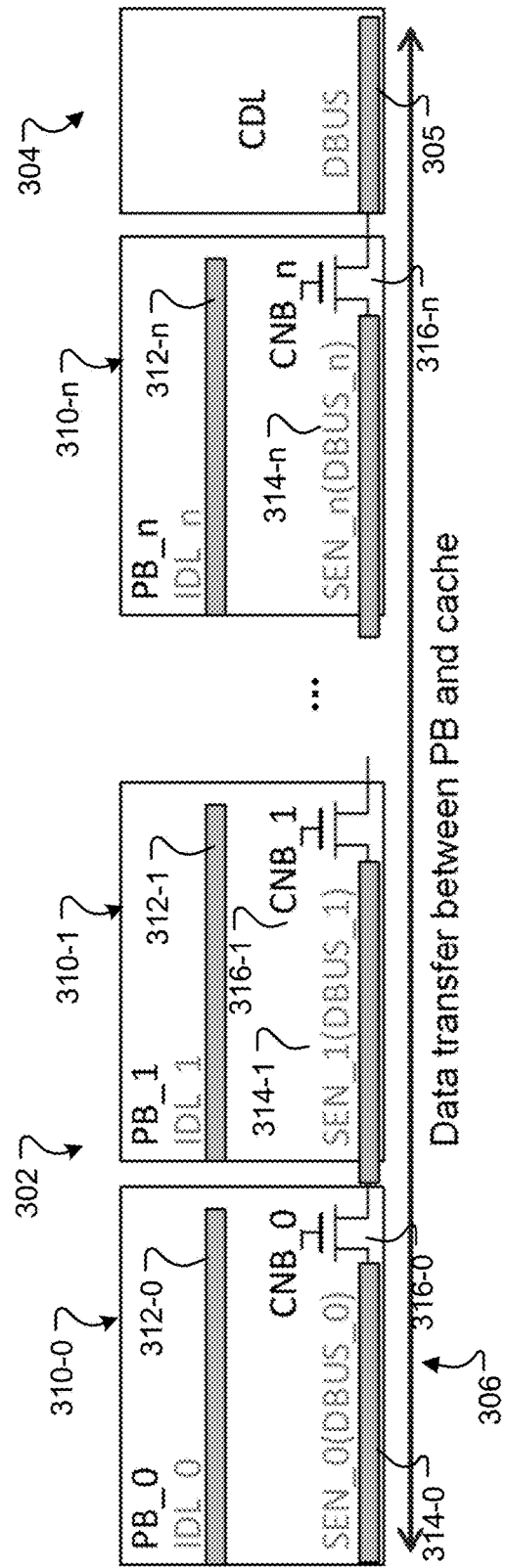
FIG. 3C
FIG. 3D

MANAGING PAGE BUFFER CIRCUITS IN MEMORY DEVICES

BACKGROUND

Integrated circuit memory devices are becoming smaller and faster. One limitation on a size of a memory device arises from a size of an actual sensing capacitor in a page buffer circuit. To sense data stored in the memory device, the actual sensing capacitor needs to have a large capacitance, which normally requires a large area. Therefore, it would be desirable to develop a page buffer circuit that can provide a large and stable capacitance without the actual sensing capacitor.

SUMMARY

The present disclosure describes methods, systems, devices, circuits, and techniques for managing page buffer circuits in memory devices, for example, by providing page buffers that use existed metal routing (e.g., global data bus (DBUS) metal lines) to form parasitic capacitors, without using any actual capacitors or any extra metal routing.

One aspect of the present disclosure features a memory device, including: a memory cell array including memory cells; a page buffer circuit including a plurality of page buffers coupled to the memory cell array; and a cache data latch (CDL) circuit including a plurality of caches coupled to the plurality of page buffers in the page buffer circuit through a plurality of data bus (DBUS) sections. The plurality of DBUS sections are configured to be conductively connected together as a data bus for data transfer. Each DBUS section of the plurality of DBUS sections corresponds to a page buffer of the plurality of page buffers and is configured to conductively separate from at least one adjacent DBUS section for data sensing in the memory cell array. Each DBUS section can be configured to form a parasitic capacitor with at least one inner conductive line in the page buffer for the data sensing.

In some embodiments, the memory device further includes a plurality of bit lines coupled between the memory cell array and the page buffer circuit. Each page buffer of the plurality of page buffers is conductively coupled to a corresponding memory cell in the memory cell array through a bit line of the plurality of bit lines.

In some embodiments, the memory device includes a plurality of connection transistors coupled between adjacent DBUS sections in the plurality of DBUS sections. The plurality of connection transistors are configured to: be turned on to conductively connect the plurality of DBUS sections together to form the data bus, and be turned off to conductively separate the plurality of DBUS sections from each other. Each DBUS section can function as a sensing node in the page buffer to form the parasitic capacitor with the at least one inner conductive line in the page buffer.

In some embodiments, each connection transistor of the plurality of connection transistors is coupled between two adjacent DBUS sections and arranged between adjacent page buffers corresponding to the two adjacent DBUS sections.

In some embodiments, each page buffer of the plurality of page buffers includes: a first transistor configured to be a connection transistor corresponding to the page buffer among the plurality of connection transistors, and a DBUS section of the plurality of DBUS sections. The first transistor has a first terminal coupled to the DBUS section of the page buffer, a second terminal coupled to an adjacent DBUS section of an adjacent page buffer, and a gate terminal configured to receive a control signal for turning on or off the first transistor.

In some embodiments, each page buffer of the plurality of page buffers further includes a second transistor having: a first terminal coupled to one or more latches in the page buffer through the at least one inner conductive line, a second terminal coupled to the DBUS section, and a gate terminal coupled to receive a second control signal for turning on or off the second transistor. The memory device can be configured to: turn on the plurality of connection transistors to conductively connect the plurality of DBUS sections to form the data bus, and turn on a respective second transistor of a particular page buffer of the plurality of page buffers and turn off second transistors in other page buffers of the plurality of page buffers, such that data latched in the particular page buffer is transferred from the particular page buffer to a corresponding cache in the CDL circuit through the data bus.

In some embodiments, the second transistor is configured to be turned on to couple the DBUS section to a supply voltage for precharging the parasitic capacitor of the page buffer while the plurality of connection transistors are turned off to conductively separate the plurality of DBUS sections.

In some embodiments, each page buffer of the plurality of page buffers includes: a DBUS section having a first sub-section and a second sub-section, a section transistor coupled between the first sub-section and the second sub-section. The section transistor can be configured to: be turned on to conductively connect the first sub-section and the second sub-section to form the DBUS section such that the plurality of DBUS sections are configured to be conductively connected together as the data bus, and be turned off to conductively separate the first sub-section and the second sub-section such that the first sub-section forms the parasitic capacitor with a corresponding inner conductive line in the page buffer.

In some embodiments, the first sub-section is a non-coupling-noise sub-section, and the second sub-section is coupling-noise sub-section.

In some embodiments, the first sub-section of the DBUS section is positioned adjacent to an inner data-bus line (IDL) in the page buffer, and the second sub-section of the DBUS section is positioned adjacent to a bit line through which the page buffer is coupled to the memory cell array.

In some embodiments, the plurality of page buffers include first and second page buffers sequentially arranged in the page buffer circuit, and a second sub-section of the first page buffer is coupled to a first sub-section of the second page buffer by a corresponding connection transistor of the plurality of connection transistors.

In some embodiments, the plurality of page buffers include first, second, and third page buffers arranged in order in the page buffer circuit, and second sub-sections of the first and second page buffers are conductively connected, and first sub-sections of the second and third page buffers are coupled through a corresponding connection transistor of the plurality of connection transistors. In some embodiments, each of the first and third page buffers includes no connection transistor, and the second page buffer includes the corresponding connection transistor.

In some embodiments, the plurality of page buffers include multiple pairs of first and second page buffers arranged in order in the page buffer circuit, and second sub-sections of the first and second page buffers are conductively connected, and first sub-sections of the first and second page buffers are respectively coupled to first subsections of adjacent page buffers in adjacent pairs through corresponding connection transistors of the plurality of connection transistors.

In some embodiments, each page buffer in the page buffer circuit includes a plurality of latches each conductively coupled to an inner data-bus line (IDL) in the page buffer, and the IDL in the page buffer is configured to form the parasitic capacitor with a corresponding DBUS section for the page buffer.

In some embodiments, the IDL is positioned adjacent to and parallel to the corresponding DBUS section and conductively separated by an insulating material. In some embodiments, inner conductive lines in the plurality of page buffers and the plurality of DBUS sections are formed in a layer adjacent to the memory cell array.

In some embodiments, each page buffer in the page buffer circuit includes: a sensing latch coupled to the memory cell array, and a latch transistor coupled between the sensing latch and the IDL and configured to be turned on to conductively connect the sensing latch to the IDL or be turned off to separate the sensing latch from the IDL.

In some embodiments, each page buffer in the page buffer circuit includes a boosting transistor having: a first terminal coupled to the IDL, a second terminal configured to receive a boosting signal, and a gate terminal configured to receive a control signal to turn on or off the boosting transistor, and the boosting transistor can be configured to be turned on such that a voltage level of the IDL is controlled based on a voltage level of the boosting signal.

Another aspect of the present disclosure features a page buffer circuit including: a plurality of page buffers and a plurality of data bus (DBUS) sections. The plurality of DBUS sections are configured to be conductively connected together as a data bus, and each DBUS section in the plurality of DBUS sections corresponds to a page buffer of the plurality of page buffers, and is configured to conductively separate from at least one adjacent DBUS section for example, to form a parasitic capacitor with at least one inner conductive line in the page buffer.

In some embodiments, the page buffer circuit includes a plurality of connection transistors coupled between adjacent DBUS sections in the plurality of DBUS sections. The plurality of connection transistors are configured to: be turned on to conductively connect the plurality of DBUS sections together to form the data bus, and be turned off to conductively separate the plurality of DBUS sections from each other.

In some embodiments, each page buffer of the plurality of page buffers includes: a DBUS section of the plurality of DBUS sections, a first transistor configured to be a connection transistor corresponding to the page buffer among the plurality of connection transistors, and a second transistor having: a first terminal coupled to one or more latches in the page buffer through the at least one inner conductive line, a second terminal coupled to the DBUS section, and a gate terminal coupled to receive a second control signal for turning on or off the second transistor. The plurality of connection transistors can be configured to be turned on to conductively connect the plurality of DBUS sections to form the data bus, and a particular second transistor of a particular page buffer in the plurality of page buffers is configured to be turned on and second transistors of other page buffers of the plurality of page buffers are configured to be turned off, such that data latched in the particular page buffer is transferred from the particular page buffer to a corresponding cache in a cache data latch (CDL) circuit through the data bus.

In some embodiments, each page buffer of the plurality of page buffers includes: a DBUS section having a first sub-section and a second sub-section, and a section transistor coupled between the first sub-section and the second sub-section. The section transistor can be configured to: be turned on to conductively connect the first sub-section and the second sub-section to form the DBUS section such that the plurality of DBUS sections are configured to be conductively connected together as the data bus, and be turned off to conductively separate the first sub-section and the second sub-section such that the first sub-section forms the parasitic capacitor with a corresponding inner conductive line in the page buffer.

In some embodiments, the plurality of page buffers include first and second page buffers sequentially arranged in the plurality of page buffers, and a second sub-section of the first page buffer is coupled to a first sub-section of the second page buffer by a corresponding connection transistor of the plurality of connection transistors.

In some embodiments, the plurality of page buffers include first, second, and third page buffers arranged in order in the plurality of page buffers. Second sub-sections of the first and second page buffers can be conductively connected, and first sub-sections of the second and third page buffers are coupled through a corresponding connection transistor of the plurality of connection transistors. Each of the first and third page buffers can include no connection transistor, and the second page buffer can include the corresponding connection transistor.

In some embodiments, each page buffer of the plurality of page buffers includes: a plurality of latches each conductively coupled to an inner data-bus line (IDL) in the page buffer, a sensing latch, and a latch transistor coupled between the sensing latch and the IDL and configured to be turned on to conductively connect the sensing latch to the IDL or be turned off to separate the sensing latch from the IDL. The IDL in the page buffer can be configured to form the parasitic capacitor with a corresponding DBUS section for the page buffer.

In some embodiments, each page buffer of the plurality of page buffers includes a boosting transistor having: a first terminal coupled to the IDL, a second terminal configured to receive a boosting signal, and a gate terminal configured to receive a control signal to turn on or off the boosting transistor, and the boosting transistor can be configured to be turned on such that a voltage level of the IDL is associated with a voltage level of the boosting signal.

Another aspect of the present disclosure features an integrated circuit including: a first circuit including a plurality of sub-circuits and a second circuit coupled to the first circuit through a plurality of conductive sections. The plurality of conductive sections are configured to be conductively connected together as a conductive bus between the first circuit and the second circuit, and each conductive section in the plurality of conductive sections corresponds to a sub-circuit in the first circuit, and is configured to conductively separate from at least one adjacent conductive section, for example, to form a parasitic capacitor with at least one inner conductive line in the sub-circuit.

In some embodiments, the first circuit includes a page buffer circuit including a plurality of page buffers, and the second circuit includes a cache data latch (CDL) circuit including a plurality of caches, and the integrated circuit can be configured to transfer data from a page buffer in the page buffer circuit to a corresponding cache in the CDL circuit through the conductive bus.

Another aspect of the present disclosure features a method including: conductively separating a plurality of data bus sections that are coupled between page buffers in a page buffer circuit and caches in a cache data latch (CDL) circuit, such that each data bus section forms a parasitic capacitor with at least one inner conductive line in a corresponding page buffer; and conductively connecting the plurality of data bus sections together to form a data bus for transferring data from one or more page buffers in the page buffer circuit to one or more corresponding caches in the CDL circuit.

In some embodiments, the method further includes: for a page buffer in the page buffer circuit, precharging a corresponding parasitic capacitor formed by a corresponding data bus section and a corresponding inner conductive line in the page buffer; discharging a sensing voltage at the corresponding data bus section by conductively connecting the corresponding data bus section to a memory cell through a corresponding bit line; and strobing a sensing result corresponding to data in the memory cell to a latch of the page buffer.

In some embodiments, the method further includes: after precharging the corresponding parasitic capacitor and before discharging the sensing voltage at the corresponding data bus section, boosting up a voltage level at the corresponding data bus section by increasing a voltage level at the corresponding inner conductive line; and after discharging the sensing voltage at the corresponding data bus section and before strobing the sensing result, boosting down the discharged sensing voltage at the corresponding data bus section by decreasing the voltage level at the corresponding inner conductive line.

In some embodiments, the page buffer includes a particular transistor coupled between the corresponding inner conductive line and the corresponding data bus section. The method can further include: turning on the particular transistor in the page buffer and turning off particular transistors in other page buffers in the page buffer circuit to transfer data latched in the page buffer to a corresponding cache in the CDL circuit through the data bus.

In some embodiments, the method includes: sequentially turning on a corresponding particular transistor in each of the page buffers in the page buffer circuit to transfer data latched in the page buffer to a corresponding cache in the CDL circuit through the data bus.

In some embodiments, the method includes: in response to receiving a read command for reading data from a memory cell array coupled to the page buffer circuit, conductively separating the plurality of data bus sections such that each data bus section forms the parasitic capacitor with at least one inner conductive line in the corresponding page buffer for sensing the data in the memory cell array.

In some embodiments, the method includes: in response to receiving a data transfer command for transferring the data from the one or more page buffers in the page buffer circuit to the one or more corresponding caches in the CDL circuit, conductively connecting the plurality of data bus sections together to form the data bus.

Implementations of the above techniques include methods, systems, circuits, computer program products and computer-readable media. In one example, a method can be performed in a non-volatile memory and the method can include the above-described actions, e.g., the actions for managing page buffer circuits. In another example, one such computer program product is suitably embodied in a non-transitory machine-readable medium that stores instructions executable by one or more processors. The instructions are configured to cause the one or more processors to perform the above-described actions. One such computer-readable medium stores instructions that, when executed by one or more processors, are configured to cause the one or more processors to perform the above-described actions.

The techniques can be implemented in any type of circuits or devices that need capacitors for implementing one or more functions. The techniques can replace actual capacitors with parasitic capacitors formed between conductive lines. For example, in a memory device such as NAND flash memory, a page buffer implemented according to the techniques can implement functions of a traditional metal-oxide-semiconductor (MOS) capacitor: a sensing accuracy and execution of voltage boosting of a sensing node, without using the MOS capacitor that can occupy a large page buffer area (e.g., about 20%). Also, compared to using inner metal lines inside a page buffer to get a limited parasitic sensing capacitance, the page buffer implemented herein uses a long outer (or global) data bus metal line (e.g., DBUS) and an inner data-bus metal line (e.g., IDL) to achieve a larger sensing capacitance, which can avoid to be limited by a poor metal routing resource in the page buffer. The techniques also enable to reduce a device area (e.g., a size of a page buffer circuit and/or a memory device), minimize capacitor variation (e.g., caused by gate capacitors), reduce power consumption (e.g., due to large-area capacitors), and improve device performance (e.g., a sensing accuracy) with large capacitance.

The techniques can be implemented with any types of memory transistors (or memory cells), any types of metal-oxide-silicon (MOS) transistors, e.g., n-channel and/or p-channel transistors, any types of bipolar junction transistors (BJTs), and any types of operational amplifiers. The techniques can be applied to different types of memory systems, e.g., two-dimensional (2D) memory systems or three-dimensional (3D) memory systems. The techniques can be applied to various memory cell types, such as SLC (single-level cell), or MLC (multi-level cell) like 2-level cell, TLC (triple-level cell), TLC (quad-level cell), or PLC (Penta-level cell). The techniques can be applied to various types of volatile memory devices or non-volatile memory devices, such as Static Random Access Memory (SRAM), Dynamic Random Access Memory (DRAM), flash memory such as NOR flash memory and/or NAND flash memory, resistive random-access memory (RRAM), magnetoresistive random-access memory (MRAM), phase-change random-access memory (PCRAM), among others. Additionally or alternatively, the techniques can be applied to various types of devices and systems, such as secure digital (SD) cards, embedded multimedia cards (eMMC), or solid-state drives (SSDs), embedded systems, among others.

The details of one or more disclosed implementations are set forth in the accompanying drawings and the description below. Other features, aspects, and advantages will become apparent from the description, the drawings and the claims.

BRIEF DESCRIPTION OF THE DRAWINGS

FIG. 3C illustrates an example normal operation mode of the integrated circuit of FIG. 3A.

FIG. 3D illustrates an example data transfer mode of the integrated circuit of FIG. 3A.

Like reference numbers and designations in the various drawings indicate like elements. It is also to be understood that the various exemplary implementations shown in the figures are merely illustrative representations and are not necessarily drawn to scale.

DETAILED DESCRIPTION

Example Systems and Memory Devices

Figure 1A:
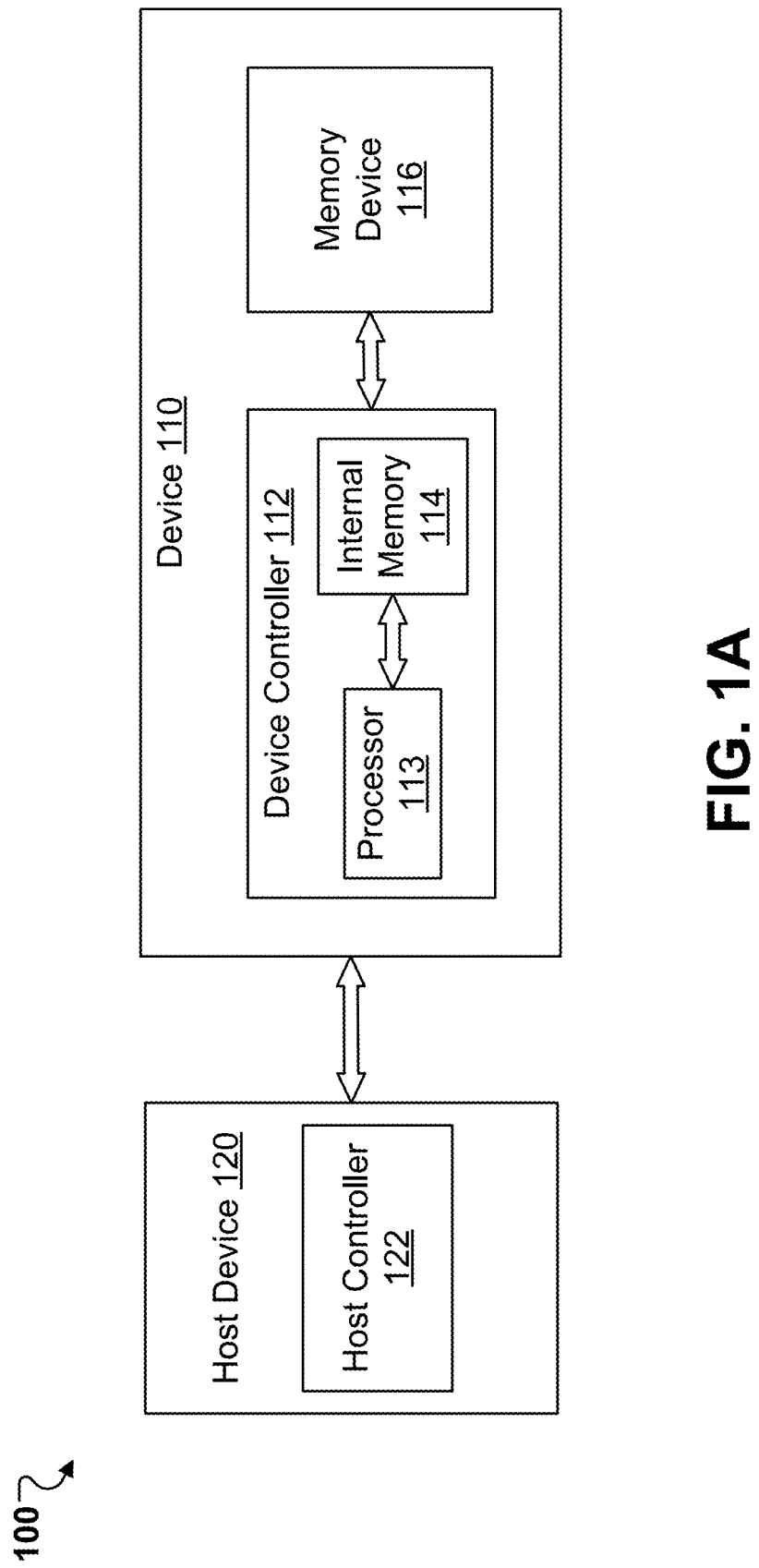
FIG. 1A illustrates an example system including a memory device.

FIG. 1A illustrates an example of a system 100. The system 100 includes a device 110 and a host device 120. The device 110 includes a device controller 112 and a memory device 116. The device controller 112 includes a processor 113 and an internal memory 114. In some implementations, the device 110 includes a plurality of memories 116 that are coupled to the device controller 112. The host device 120 includes a host controller 122 that can include at least one processor and at least one memory coupled to the at least one processor and storing programming instructions for execution by the at least one processor to perform one or more corresponding operations.

In some implementations, the device 110 is a storage device. For example, the device 110 can be an embedded multimedia card (eMMC), a secure digital (SD) card, a solid-state drive (SSD), or some other suitable storage. In some implementations, the device 110 is a smart watch, a digital camera or a media player. In some implementations, the device 110 is a client device that is coupled to a host device 120. For example, the device 110 is an SD card in a digital camera or a media player that is the host device 120.

The device controller 112 is a general-purpose microprocessor, or an application-specific microcontroller. In some implementations, the device controller 112 is a memory controller for the device 110. The following sections describe the various techniques based on implementations in which the device controller 112 is a memory controller. However, the techniques described in the following sections are also applicable in implementations in which the device controller 112 is another type of controller that is different from a memory controller.

The processor 113 is configured to execute instructions and process data. The instructions include firmware instructions and/or other program instructions that are stored as firmware code and/or other program code, respectively, in the secondary memory. The data includes program data corresponding to the firmware and/or other programs executed by the processor, among other suitable data. In some implementations, the processor 113 is a general-purpose microprocessor, or an application-specific microcontroller. The processor 113 is also referred to as a central processing unit (CPU).

The processor 113 accesses instructions and data from the internal memory 114. In some implementations, the internal memory 114 is a Static Random Access Memory (SRAM) or a Dynamic Random Access Memory (DRAM). For example, in some implementations, when the device 110 is an eMMC, an SD card or a smart watch, the internal memory 114 is an SRAM. In some implementations, when the device 110 is a digital camera or a media player, the internal memory 114 is DRAM.

In some implementations, the internal memory 114 is a cache memory that is included in the device controller 112, as shown in FIG. 1A. The internal memory 114 stores instruction codes, which correspond to the instructions executed by the processor 113, and/or the data that are requested by the processor 113 during runtime.

The device controller 112 transfers the instruction code and/or the data from the memory device 116 to the internal memory 114. The memory device 116 can be a semiconductor device. In some implementations, the memory device 116 is a non-volatile memory that is configured for long-term storage of instructions and/or data, e.g., a NAND flash memory, or some other suitable non-volatile memory. In implementations where the memory device 116 is NAND flash memory, the device 110 is a flash memory, e.g., a flash memory card, and the device controller 112 is a NAND flash controller. For example, in some implementations, when the device 110 is an eMMC or an SD card, the memory device 116 is a NAND flash; in some implementations, when the device 110 is a digital camera, the memory device 116 is an SD card; and in some implementations, when the device 110 is a media player, the memory device 116 is a hard disk.

In some implementations, the device controller 112 is configured to receive data and instructions from and to send data to the host device 120. The device controller 112 is further configured to send data and commands to the memory device 116 and to receive data from the memory device 116. For example, the device controller 112 is configured to send data and a write command to instruct the memory device 116 to store the data to a specified address. As another example, the device controller 112 is configured to receive a read request (or a read command) from the host device 120 and send a corresponding read command to the memory device 116 to read data from a specified address in the memory device 116.

The memory device 116 includes a plurality of blocks. The memory device 116 can be a two-dimensional (2D) memory including 2D memory blocks, e.g., as described with further details in FIG. 1B. The memory device 116 can also be a three-dimensional (3D) memory including 3D memory blocks, e.g., as described with further details in FIG. 1C. Each block can include a same number of pages. Each page has a unique number in the block. Data is stored in the pages of the block according to the order of the unique numbers of the pages in the block. Each page can be read or written separately, and pages in a block can be erased together.

In some implementations, a block can be divided into a number of sub-blocks. Each sub-block can include one or more pages. Each page in a sub-block can be read or written separately. The one or more pages in each sub-block can be erased together. In some implementations, the memory device 116 includes one or more dies. Each die can be a memory chip and include a number of memory arrays and peripheral circuitry thereon. A memory array can include a number of planes, with each plane including a number of physical blocks of memory cells. Each physical block can include a number of pages of memory cells that can store a number of sectors of data. A super block can be specified, e.g., by a memory controller such as the controller 112 of FIG. 1A, to combine at least one physical block from different planes. Each physical block in the super block comes from a different plane, that is, any plane cannot provide more than one block in the super block. The super block includes a number of super pages each combining multiple pages from the corresponding multiple physical blocks in the super block. Each page in a super page can have a same page number in its corresponding physical block. A super page can be programmed with all the pages in the super page being programmed simultaneously.

A memory cell can represent a number of states including an erased state and one or more programmed states. For example, in some cases, the memory cell is a single-level cell (SLC) that can store 1 bit and represent 2 states including an erased state (ER) and a programmed state (A). Memory cells in one word line can form one page. In some cases, the memory cell is a multi-level cell (MLC) such as a 2-level cell that can store 2 bits and represent 4 states including an erased state (ER) and three programmed states (A, B, and C). Memory cells in one word line can form two pages. In some cases, the memory cell is a triple-level cell (TLC) that can store 3 bits and represent 8 states including an erased state (ER) and seven programmed states (A, B, C, D, E, F, and G). Memory cells in one word line can form three pages. The states can have progressively higher voltage ranges, and the erased state has the lowest voltage rage.

Figure 1B:
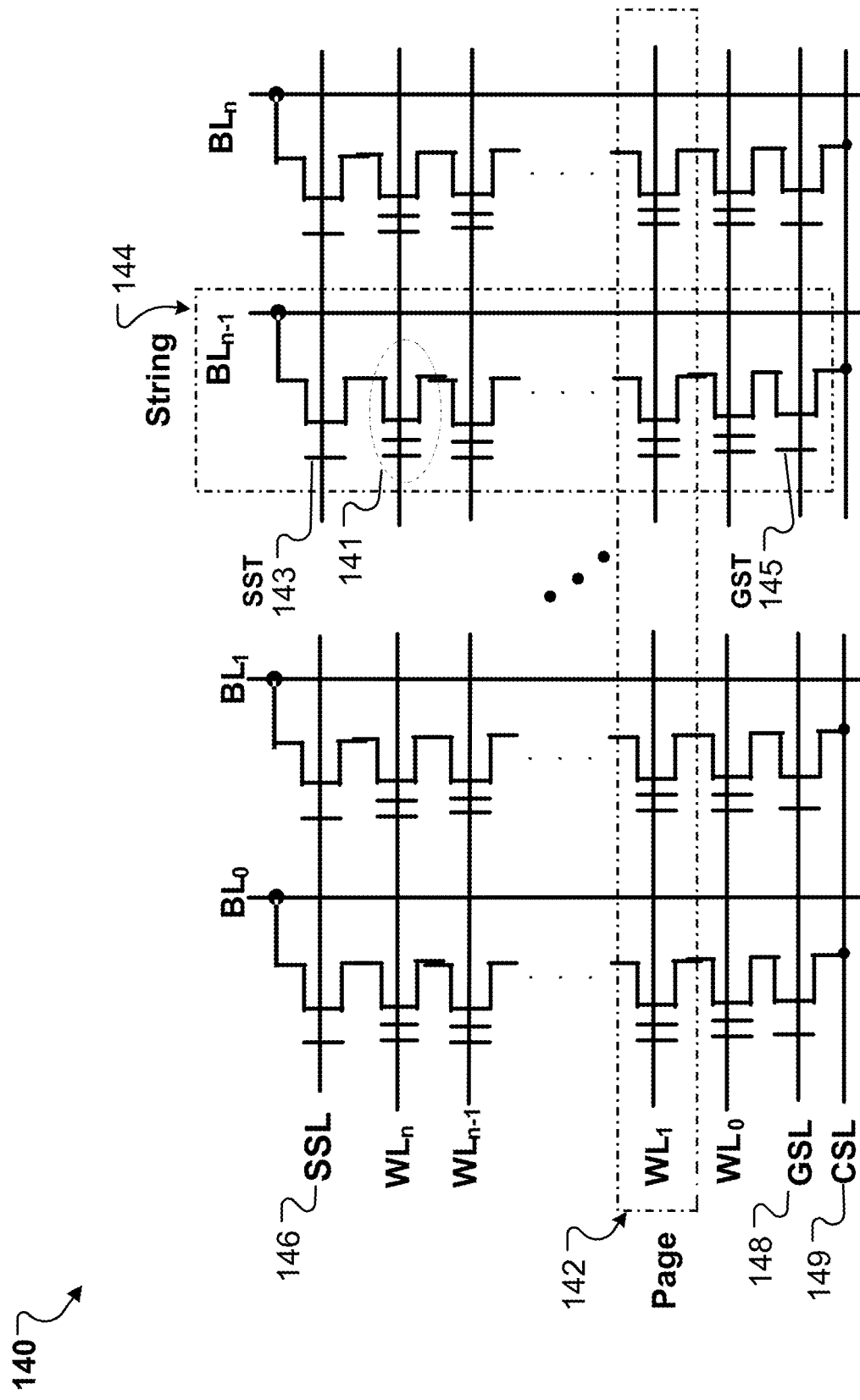
FIG. 1B illustrates an example block of a two-dimensional (2D) memory device.

FIG. 1B illustrates an example configuration of a 2D memory block 140 when the memory device 116 is a 2D memory. The block 140 includes memory cells 141 coupled in series to column bit lines $BL_0, BL_1, \ldots, BL_{n-1}$, and $BL_n$ to form a number of cell strings 144, and to row word lines $WL_0, WL_1, \ldots, WL_{n-1}$, and $WL_n$ to form a number of cell pages 142.

Each memory cell in a block includes a transistor structure having a gate, a drain, a source, and a channel defined between the drain and the source. Each memory cell is located at an intersection between a word line and a bit line, where the gate is connected to the word line, the drain is connected to the bit line, and the source is connected to a source line, which in turn is connected to common ground. In some examples, the gate of a flash memory cell has a dual-gate structure, including a control gate and a floating gate, where the floating gate is suspended between two oxide layers to trap electrons that program the cell.

A cell string 144 can include a number of memory cells 141, a string select transistor (SST) 143, and a ground select transistor (GST) 145, which are all connected in series. A gate of the SST 143 is connected to a string select line (SSL) 146. Gates of the SSTs 143 in different strings are also connected to the same SSL. Gates of the memory cells 141 are respectively connected to word lines $WL_0, WL_1, \ldots, WL_{n-1}$, and $WL_n$. The cell strings 144 or the memory cells 141 are connected to a common source line (CSL) 149 via the GST 145. The CSL 149 can be coupled to a ground or a supply voltage. A gate of the GST 145 is connected to a ground select line (GSL) 148. Gates of the GSTs 145 in different strings 144 are also connected to the same GSL 148.

A cell page 142 can include a number of memory cells 141. Gates of the memory cells 141 in the cell page 142 are coupled in series to a respective word line (WL). When an input voltage is applied to the word line, the input voltage is also applied to the gates of the memory cells 141 in the cell page 142. To read a particular cell page 142 in the block 140 in a read operation, a lower read voltage is applied onto a word line corresponding to the particular cell page 142. Meanwhile, a higher read voltage is applied onto the other cell pages in the block 140.

Figure 1C:
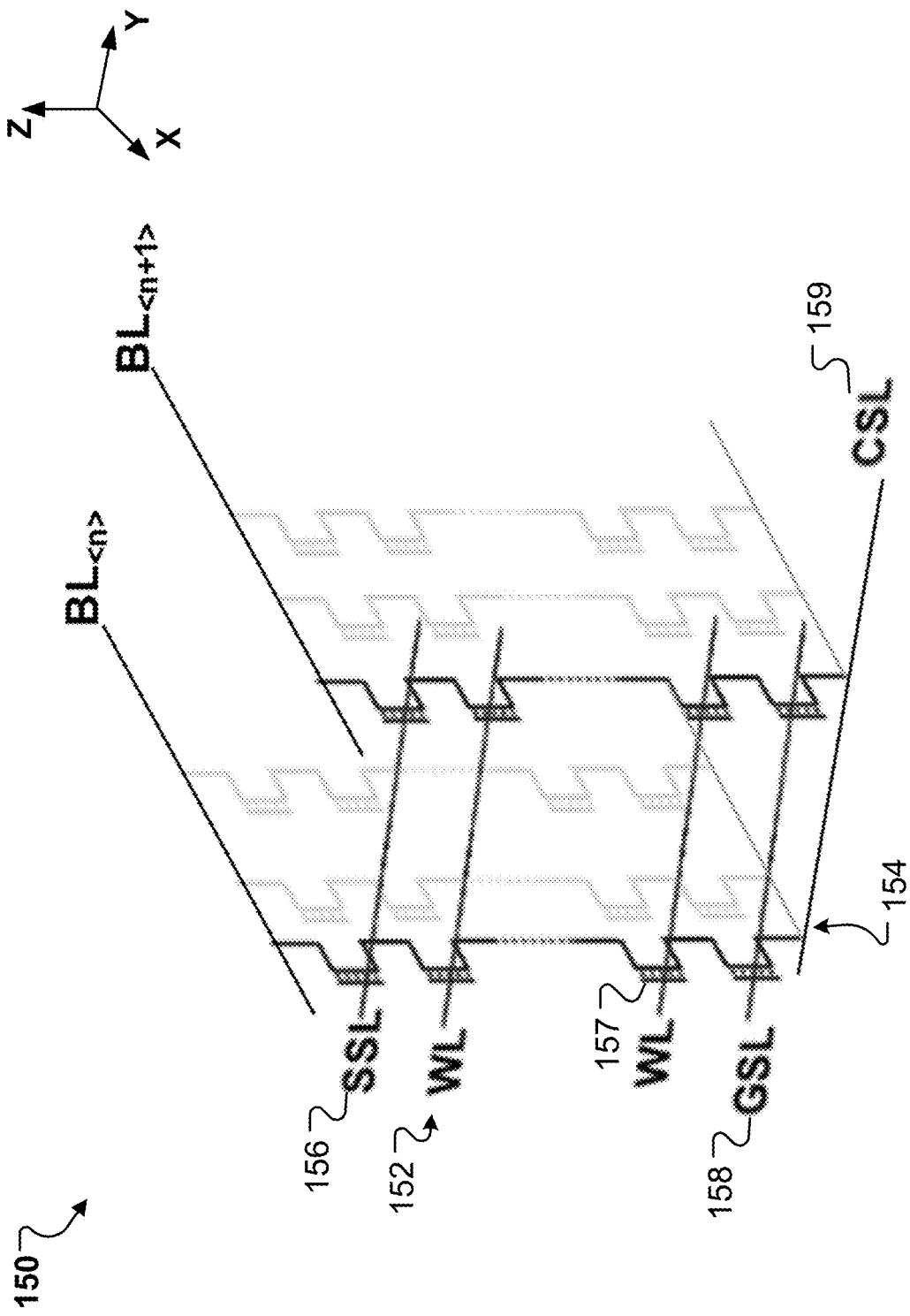
FIG. 1C illustrates an example block of a three-dimensional (3D) memory device.

FIG. 1C illustrates an example 3D memory block 150 when the memory device 116 (shown in FIG. 1A) is a 3D memory. The 3D memory block 150 can include a stack of the 2D memory block 140 of FIG. 1B. Memory cells 157 are arranged in three dimensions, e.g., in an XYZ coordinate system, and coupled to a number of word lines to form a number of cell pages (conductive layers or word line layers) 152 and a number of bit lines (e.g., $BL_{<n>}, BL_{<n+1>}$) to form a number of cell strings 154. A cell page 152 can be a layer, e.g., in the XY plane, and memory cells 157 on the same layer can be coupled to one word line and have a same voltage. Each cell page 152 can be connected to a respective contact pad in a driving circuit, e.g., X-decoder (or a scanning driver).

A cell string 154 includes a number of memory cells 157 connected in series vertically along the Z direction, where a memory cell can be configured as an SST coupled to a string select line (SSL) 156 and a memory cell can be configured as a GST coupled to a ground select line (GSL) 158. The cell strings 154 are connected to one or more drivers, e.g., data drivers. The cell strings 154 of the memory cells 157 are connected to a common source line (CSL) 159 via the ground select transistors (GSTs). The CSL 159 can be a conductive layer (or multiple conductive lines) formed on a substrate of the 3D memory. The CSL 159 can be coupled to the ground or a supply voltage.

Figure 2A:
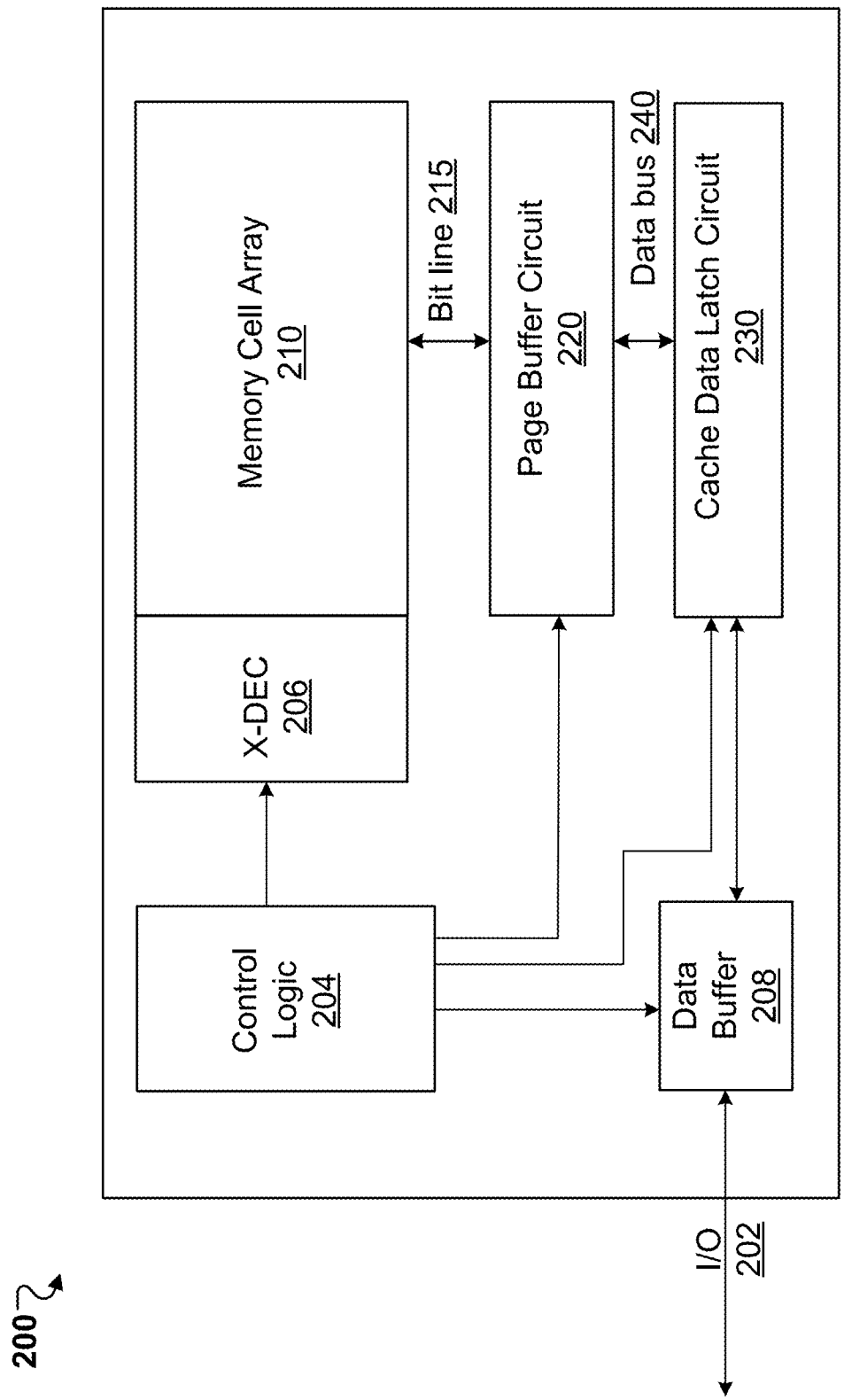
FIG. 2A illustrates an example memory device including a page buffer circuit.

FIG. 2A illustrates an example configuration of a memory device 200. The memory device 200 can be implemented as the memory device 116 of FIG. 1A. The memory device 200 includes a memory cell array 210. The memory cell array 210 can include a number of memory cells, e.g., the memory cells 141 of FIG. 1B or the memory cells 157 of FIG. 1C, coupled in series to a number of row word lines and a number of column bit lines.

A memory cell can include a memory transistor configured as a storage element. The memory transistor can include a silicon-oxide-nitride-oxide-silicon (SONOS) transistor, a floating gate transistor, a nitride read only memory (NROM) transistor, or any suitable non-volatile memory metal-oxide-semiconductor (MOS) device that can store charges.

The memory device 200 includes a memory interface 202 having multiple input/output (I/O) ports for receiving data, e.g., from a controller such as the device controller 112 or the host controller 122 of FIG. 1A, or outputting data from the memory cell array 210. The memory device 200 includes a data buffer 208 configured to buffer data received and outputted through the memory interface 202.

The memory device 200 further includes an X-decoder (or row decoder) 206 and optionally a Y-decoder. Each memory cell is coupled to the X-decoder 206 via a respective word line and coupled to the Y-decoder via a respective bit line 215. Accordingly, each memory cell can be selected by the X-decoder 206 and the Y-decoder for read or write operations through the respective word line and the respective bit line 215.

Figure 2B:
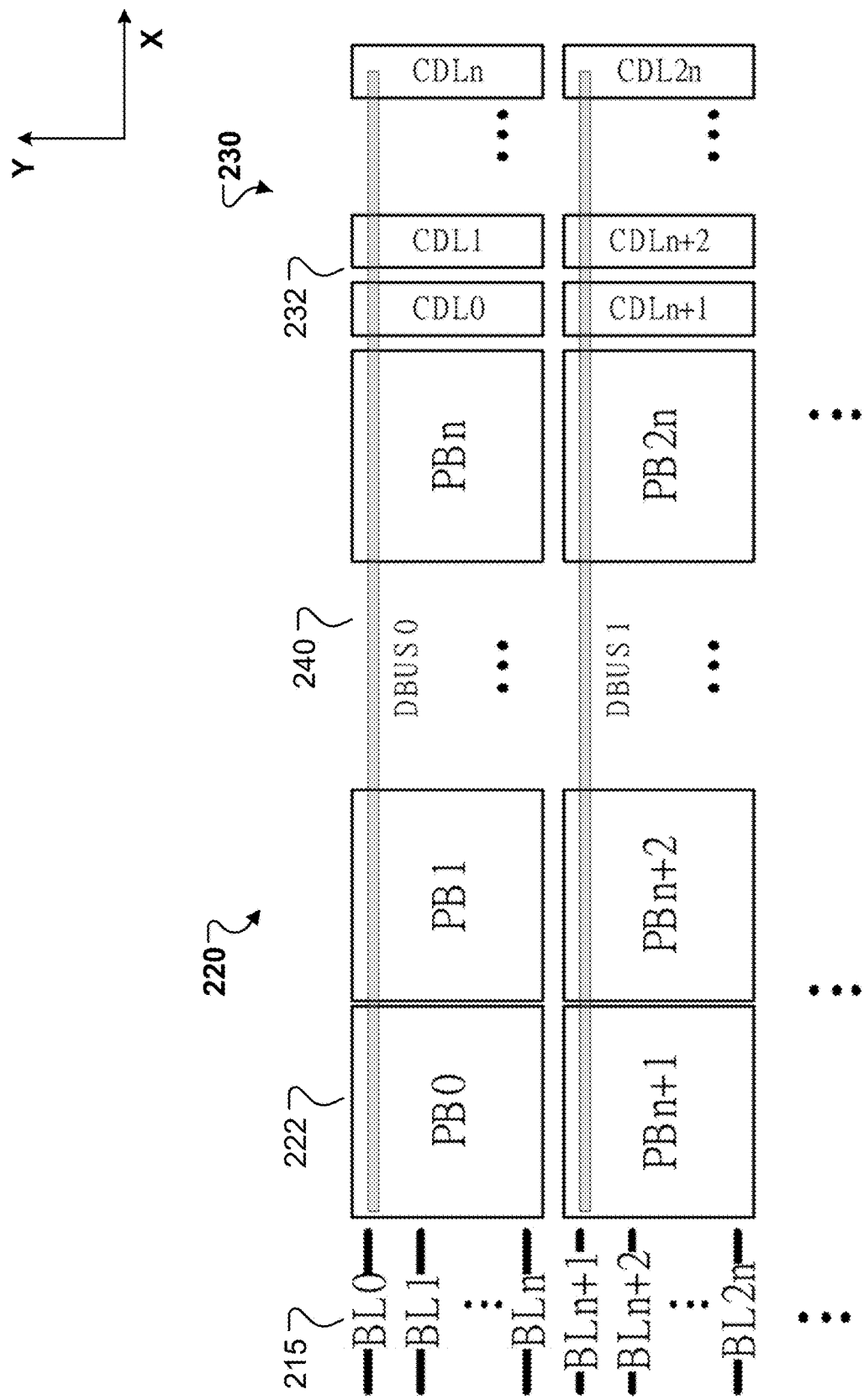
FIG. 2B illustrates an example page buffer circuit connected to a cache data latch (CDL) circuit with bus lines.

The memory device 200 includes a page buffer circuit 220 coupled to the memory cell array 210 through the bit lines 215 and a cache data latch (CDL) circuit 230 coupled to the page buffer circuit 220 through outer (or global) data bus 240. The data bus 240 can include one or more conductive lines (e.g., metal lines or metal routing). The page buffer circuit 220 can include a number of page buffers. Each page buffer can have a length along a horizontal direction (e.g., X direction) and a width along a vertical direction (e.g., Y direction), e.g., as illustrated in FIG. 2B. The page buffer includes multiple latches that can be made of a number of transistors. The transistors can be arranged along the length of the page buffer, e.g., the horizontal direction such as X direction. The transistors can be conductively connected with one another by inner metal routing lines in the page buffer, including, e.g., metal lines for DL, DLB, IDL, signal landing, and power landing, e.g., as described with further details in FIGS. 5A-5B.

FIG. 2B illustrates an example of the page buffer circuit 220 connected to the cache data latch (CDL) circuit 230 using the outer data bus lines 240. As an example, the page buffer circuit 220 includes 2*n page buffers 222 (PB0, PB1, . . . , PBn, PBn+1, PBn+2, . . . , PB2n) that can be separated into multiple columns or rows (e.g., 2), where n is an integer, e.g., in a range from 10 to 16. Each column or row can include n page buffers 222 that can be sequentially arranged along the lengths of the page buffers (e.g., the horizontal direction such as X direction). Each page buffer 222 (e.g., PB0, PB1, . . . , PBn, PBn+1, PBn+2, . . . , PB2n) is coupled to the memory cell array 210 through a respective bit line 215 (e.g., BL0, BL1, . . . BLn, BLn+1, BLn+2, . . . , BL2n), and coupled to a respective cache (e.g., CDL0, CDL1, . . . , CDLn, CDLn+1, CDLn+2, . . . , CDL2n) in the CDL circuit 230 through a corresponding data bus line 240 (e.g., DBUS_0 or DBUS_1). For example, page buffer PB0 is coupled to the memory cell array 210 through bit line BL0 and coupled to cache CDL0 through DBUS_0. The respective bit lines 215 for a column or row of page buffers can be arranged along the width of the page buffer 222 (e.g., the vertical direction such as Y direction).

The data bus line 240 is an outer (or global) metal line extending through the page buffer circuit 220 and through the CDL circuit 230. The data bus line 240 can be coupled to each page buffer 222 in the page buffer circuit 220 and coupled to each cache 232 in the CDL circuit 230. A column or row of page buffers 222 sequentially arranged along the horizontal direction can share the same corresponding data bus line 240. For example, the page buffers 222, PB0, PB1, . . . , PBn, can be connected to the caches 232, CDL0, CDL1, . . . , CDLn, by the data bus line DBUS_0, and the page buffers 222, PBn+1, PBn+2, . . . , PB2n, can be connected to the caches 232, CDLn+1, CDLn+2, . . . , CDL2n, by the data bus line DBUS_1.

With continued reference to FIG. 2A, in some embodiments, a page buffer 222 is connected to the Y-decoder through a data line associated with a corresponding bit line 215 that connects one or more memory cells in the memory cell array 210. The page buffer 222 can be configured to control a voltage on a corresponding bit line to perform an operation, e.g., read, program, or erase, on a memory cell coupled to the corresponding bit line 215. In some embodiments, during a program or erase operation, the CDL circuit 230 is configured to store data from the data buffer 208 and/or output to one or more page buffers 222 in the page buffer circuit 220. During a read operation, the CDL circuit 230 is configured to store data from one or more page buffers 222 in the page buffer circuit 220 and/or output data to the data buffer 208.

As shown in FIG. 2A, the memory device 200 can further include a control logic 204 coupled to components in the memory device 200 including the X-decoder 206 and the Y-decoder, the data buffer 208, the page buffer circuit 220, and the CDL circuit 230. The control logic 204 can be configured to receive a command, address information, and/or data, e.g., from a controller such as the device controller 112 or the host controller 122 of FIG. 1A, via the memory interface 202. The control logic 204 can also process the command, the address information, and/or the data, for example, to generate physical address information, e.g., of blocks/pages, in the memory cell array 210. The control logic 204 can include circuitry, e.g., an integrated circuit integrating multiple logics, circuits, and/or components. In some implementations, the control logic 204 includes at least one of a data register, an SRAM buffer, an address generator, a mode logic, or a state machine. The mode logic can be configured to determine whether there is a read or write operation and provide a result of the determination to the state machine.

During a write operation, the data register in the control logic 204 can register input data from the interface 202, and the address generator in the control logic 204 can generate corresponding physical addresses to store the input data in specified memory cells of the memory cell array 210. The address generator can be connected the X-decoder 206 and the Y-decoder that are controlled to select the specified memory cells through corresponding word lines and bit lines. The SRAM buffer can retain the input data from the data register in its memory as long as power is being supplied. The state machine can process a write signal from the SRAM buffer and provide a control signal to a voltage generator that can provide a write voltage to the X-decoder 206 and/or the Y-decoder. The Y-decoder is configured to output the write voltage to the bit lines (BLs) for storing the input data in the specified memory cells.

During a read operation, the state machine can provide control signals to the voltage generator and the page buffer circuit 220. The voltage generator can provide a read voltage to the X-decoder 206 and the Y-decoder for selecting a memory cell. A page buffer 222 can sense a small power signal (e.g., a current signal) that represents a data bit ("1" or "0") stored in the selected memory cell through a bit line 215 coupled to the page buffer 222 and the selected memory cell. A sense amplifier can amplify the small power signal swing to recognizable logic levels so the data bit can be interpreted properly by logic inside or outside the memory device 200. In some implementations, at least one of the page buffer circuit 220 or the CDL circuit 230 is included in the sense amplifier. The data buffer 208 can receive the amplified voltage from the sensor amplifier and output the amplified power signal to the logic outside the memory device 200 through the memory interface 202.

To sense data stored in a memory cell by sensing a current through a corresponding bit line, a page buffer can have a sensing capacitor on a sensing node for precharging and discharging at the sensing node. During a precharging phase of the page buffer, the sensing capacitor on the sensing node is precharged to have a predetermined sensing voltage. Then during a discharging phase following the precharging phase, charges stored in the sensing capacitor is discharged by a sensing current flowing to the memory cell via a corresponding bit line. Bit values latches in one or more latches in the page buffer can be updated based on a discharged sensing voltage $V_{SEN}$ at the sensing node.

During a sensing phase (or a strobing phase) following the discharging phase, if the memory cell stores a bit "0", the discharged sensing voltage $V_{SEN}$ at the sensing node can be greater than a predetermined threshold voltage $V_{Th}$, e.g., a strobe voltage $V_{Strobe}$ associated with latches in the page buffer. Accordingly, the page buffer can be configured to update a bit value "1" latched in the one or more latches to sensing value "0" or to strobe the sensing value "0" to the one or more latches. In contrast, if the memory cell stores a bit "1", the discharged sensing voltage $V_{SEN}$ at the sensing node can be smaller than or equal to the predetermined threshold voltage $V_{Th}$. Accordingly, the page buffer can be configured to maintain (or keep) the bit value "1" latches in the one or more latches.

If the capacitance at the sensing node is not stable and changes dramatically, e.g., near the threshold voltage $V_{Th}$, the sensing result may be wrong. If the capacitance at the sensing node is small, the precharging and discharging phases cannot be fully performed for sensing. Thus, it is desirable for the page buffer to have a large and stable capacitance for the capacitor on the sensing node to be fully and stably precharged and discharged to thereby achieve accurate sensing. In some implementations, a transistor, e.g., a metal-oxide-semiconductor field-effect transistor (MOSFET), is used as a capacitor (e.g., a MOS capacitor) coupled to the sensing node in a page buffer. However, the transistor having a large capacitance tends to have a large size occupying a large area, which makes a total area of the page buffer increase.

Implementations for the present disclosure provide techniques for managing page buffer circuits in memory devices, for example, by providing a page buffer that uses existed metal routing (e.g., data bus (DBUS) metal routing), without using any extra metal routing, to replace an actual capacitor at a sensing node in the page buffer.

The existed metal routing, e.g., DBUS metal routing such as 240 of FIGS. 2A-2B, is configured to transfer data between page buffers in a page buffer circuit (e.g., the page buffer circuit 220 of FIGS. 2A-2B) and caches in a cache data latch (CDL) circuit (e.g., the CDL circuit 230 of FIGS. 2A-2B) by passing through the page buffer circuit and the CDL circuit. In some embodiments, e.g., as described with further details in FIG. 3A, the existed DBUS metal routing can be cut apart into a series of DBUS sections (or partial DBUS metal lines) by each page buffer length, e.g., using first connection transistors coupled between adjacent page buffers or adjacent DBUS sections.

Figures 3A, 3B:
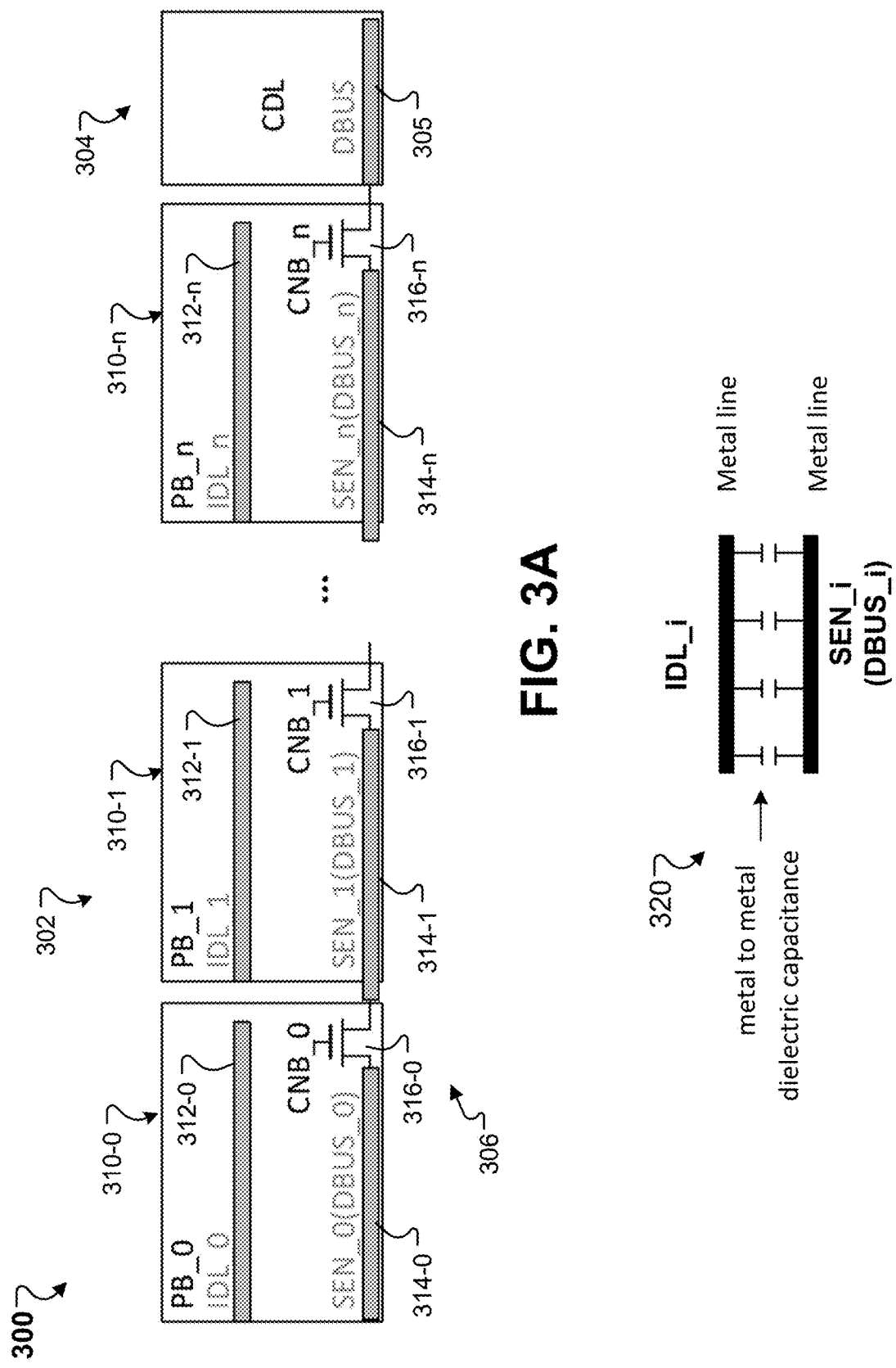
FIG. 3A illustrates an example integrated circuit including a page buffer circuit and a CDL circuit connected with a series of data bus sections.
FIG. 3B illustrates an example of a parasitic capacitor formed in the page buffer circuit of FIG. 3A.

In a normal operation (e.g., a read operation), e.g., as described with further details in FIG. 3C, the first connection transistors are turned off, and each DBUS section is used as a sensing node for a corresponding page buffer. The sensing node can have a sensing capacitance formed by a parasitic capacitor defined between the DBUS section and one or more inner metal lines (e.g., inner data-bus line such as IDL metal line) in the corresponding page buffer, without using an extra capacitor and any extra routing resource, e.g., as described with further details in FIG. 3B.

In a data transfer operation, e.g., as described with further details in FIG. 3D, all the first connection transistors are turned on to be connected together, and the series of DBUS sections are thus sequentially and conductively connected together as an integrated DBUS to transfer data between page buffers in the page buffer circuit and caches in the CDL circuit. Each page buffer can include an additional transistor, different from the first connection transistor, that can be individually and optionally sequentially turned on to transfer data from the page buffer to a corresponding cache in the CDL circuit via the same integrated DBUS, e.g., as described with further details in FIGS. 8A-8B.

Figure 6A:
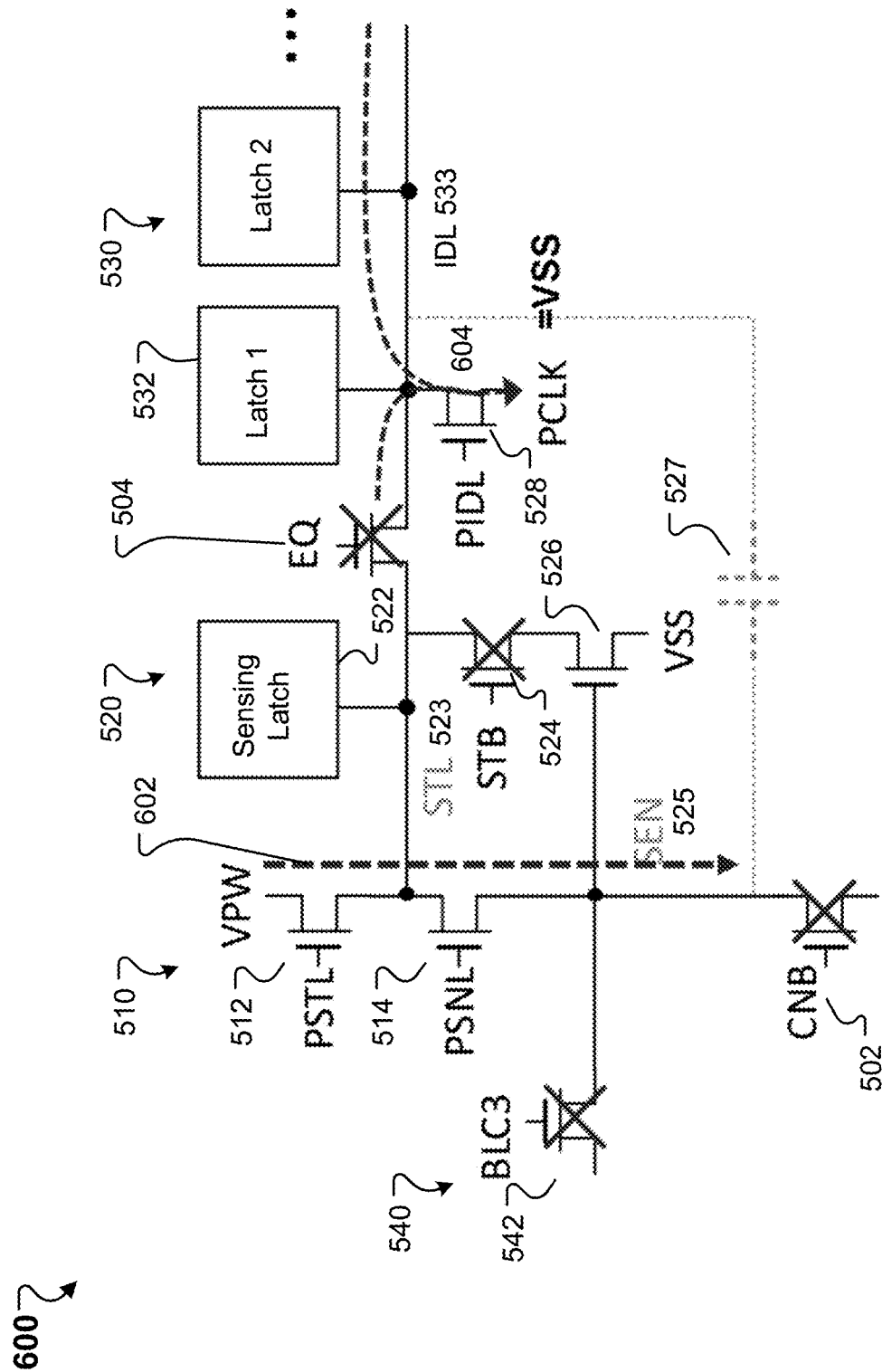
FIGS. 6A-6E show example circuit diagrams of a page buffer of FIG. 5A in different operation phases.
Figure 6B:
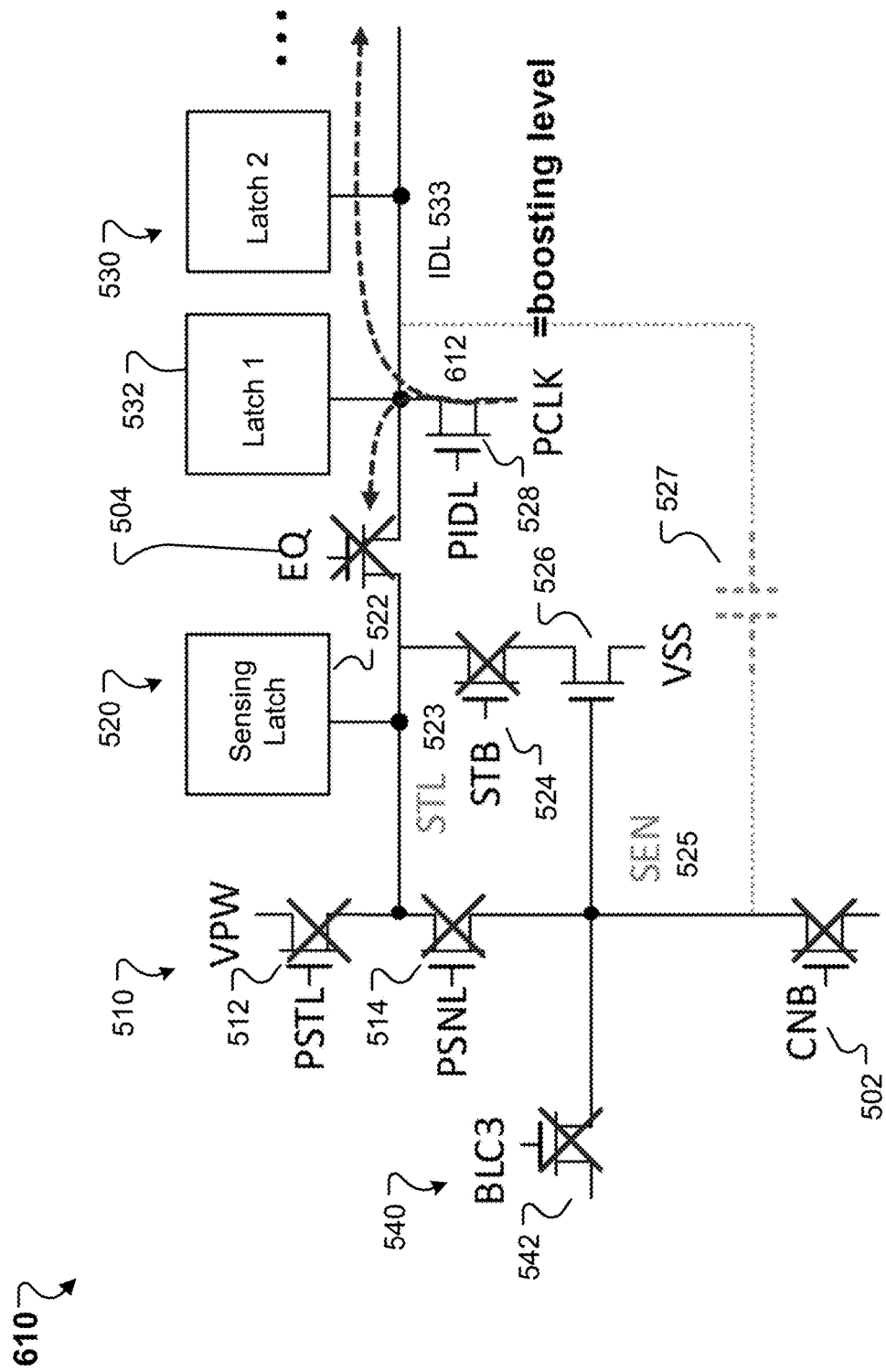
Figure 6C:
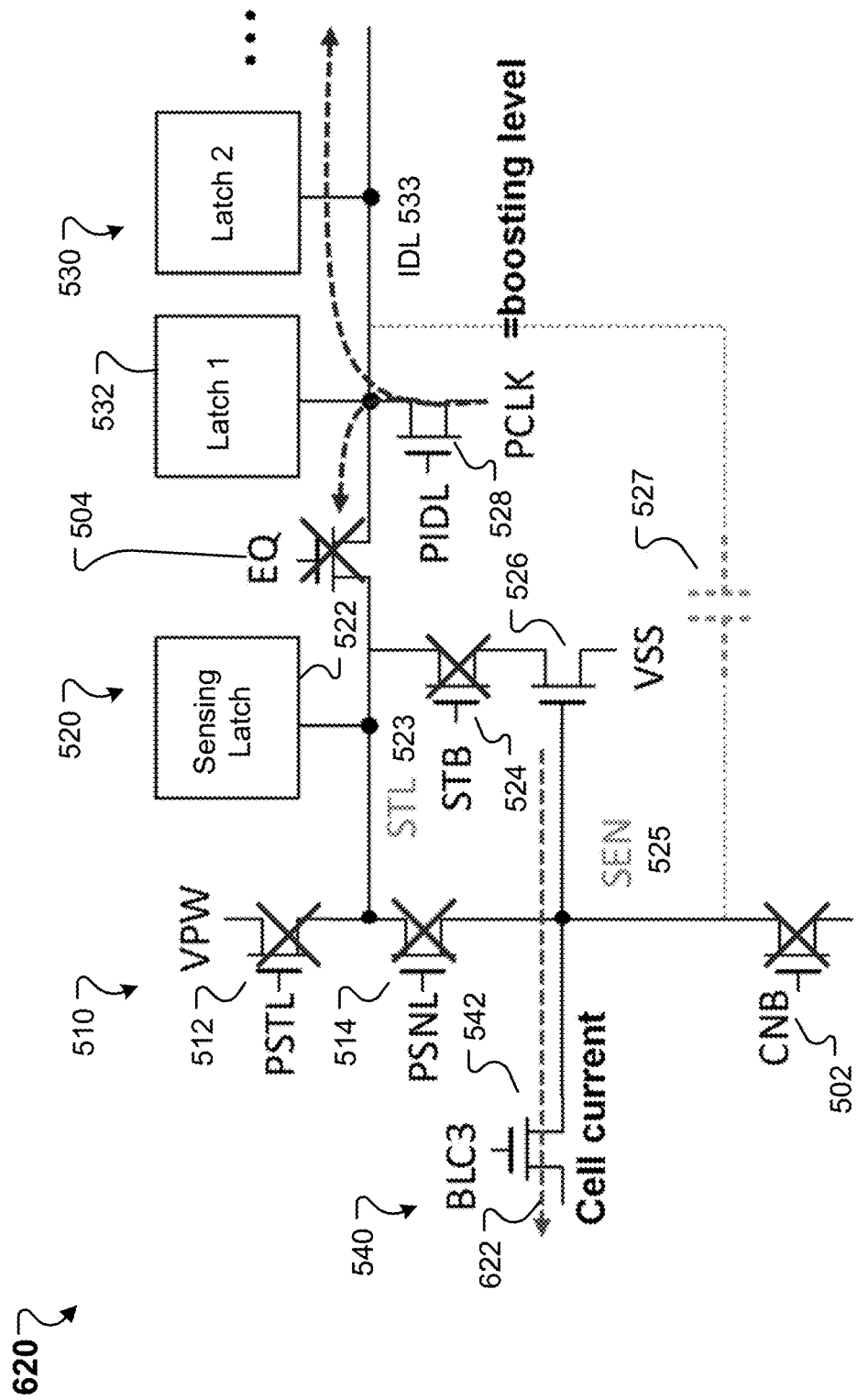
Figure 6D:
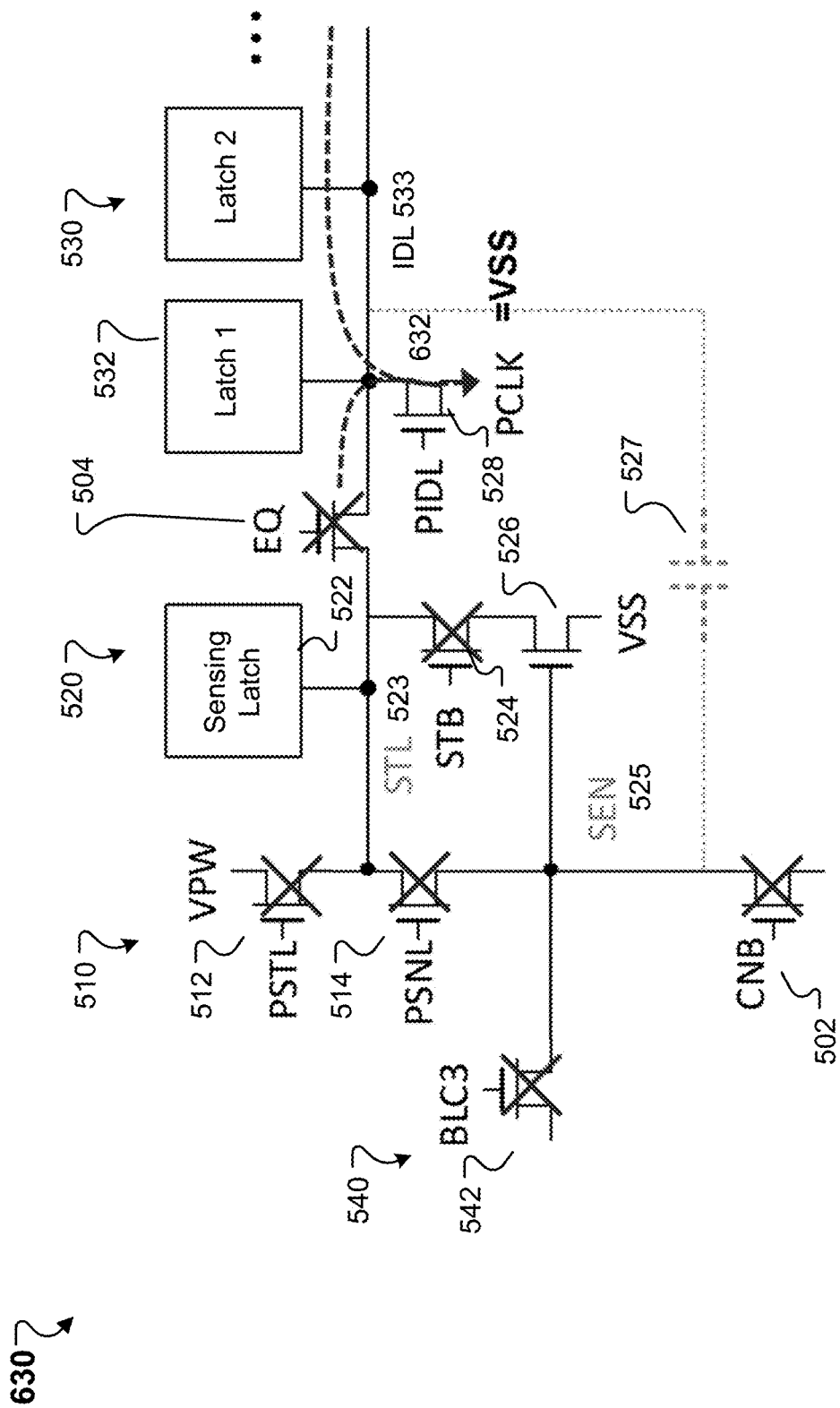

The page buffer with the parasitic capacitor at the sensing node can also implement voltage boosting to overcome a voltage gap between a bit line operation bias and a sensing strobing bias, e.g., as described with further details in FIGS. 6B-6D. In some embodiments, the inner metal line, e.g., IDL, connects latches in the page buffer and passes through the page buffer, and can be used with a corresponding DBUS section (e.g., used as the sensing node) via a metal line coupling effect to achieve the voltage boosting at the sensing node.

Each DBUS section in a page buffer region can include at least two sub-sections, e.g., a non-coupling noise sub-section and a coupling noise sub-section. The non-coupling noise sub-section of the partial DBUS section can be arranged adjacent to an inner metal line (e.g., IDL) to form the parasitic capacitor. The coupling noise sub-section of the partial DBUS section can suffer unexpected metal line to metal line coupling noise, e.g., due to being adjacent to a bit line. In some embodiments, the two sub-sections of each DBUS section are connected via a second connection transistor (or a section transistor), and thus the coupling noise sub-section can be configured to be conductively separated from the non-coupling noise sub-section during the normal operation of the page buffer, and conductively connected with the non-coupling noise sub-section during the data transfer operation.

Figure 4A:
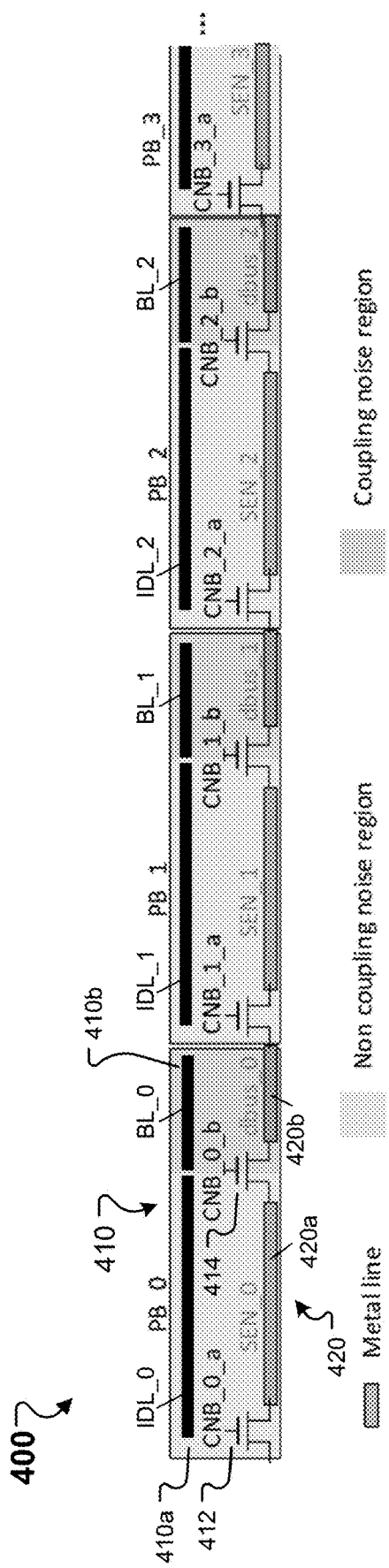
FIG. 4A illustrates an example page buffer circuit with a sequence page buffer placement.

In some embodiments, each page buffer includes the first connection transistor and the second connection transistor, and the page buffers in the page buffer circuit are connected together in a sequence arrangement, e.g., as described with further details in FIG. 4A. In some embodiments, the page buffer circuit includes a number of pairs of adjacent page buffers that are connected together in a mirror arrangement, e.g., as described with further details in FIG. 4B. Each pair includes first and second page buffers. Coupling noise sub-sections of the first and second page buffers are connected together. A non-coupling noise sub-section of each of the first and second page buffers is coupled to a non-coupling noise sub-section of another page buffer in another pair through a first connection transistor. In such a way, each pair in the mirror arrangement can include three transistors (two second connection transistors and one first connection transistor), which can include less transistors than two adjacent page buffers in the sequence arrangement having four transistors (two second connection transistors and two first connection transistors).

Example Integrated Circuits

FIG. 3A illustrates an example integrated circuit 300 including a page buffer circuit 302 and a cache data latch (CDL) circuit 304 that are connected by a data bus 306 formed by a series of data bus (DBUS) sections. The page buffer circuit 302 can be the page buffer circuit 220 of FIGS. 2A-2B. The CDL circuit 304 can be the CDL circuit 230 of FIGS. 2A-2B. The data bus 306 can be implemented as the data bus 240 of FIGS. 2A-2B.

Figure 5A:
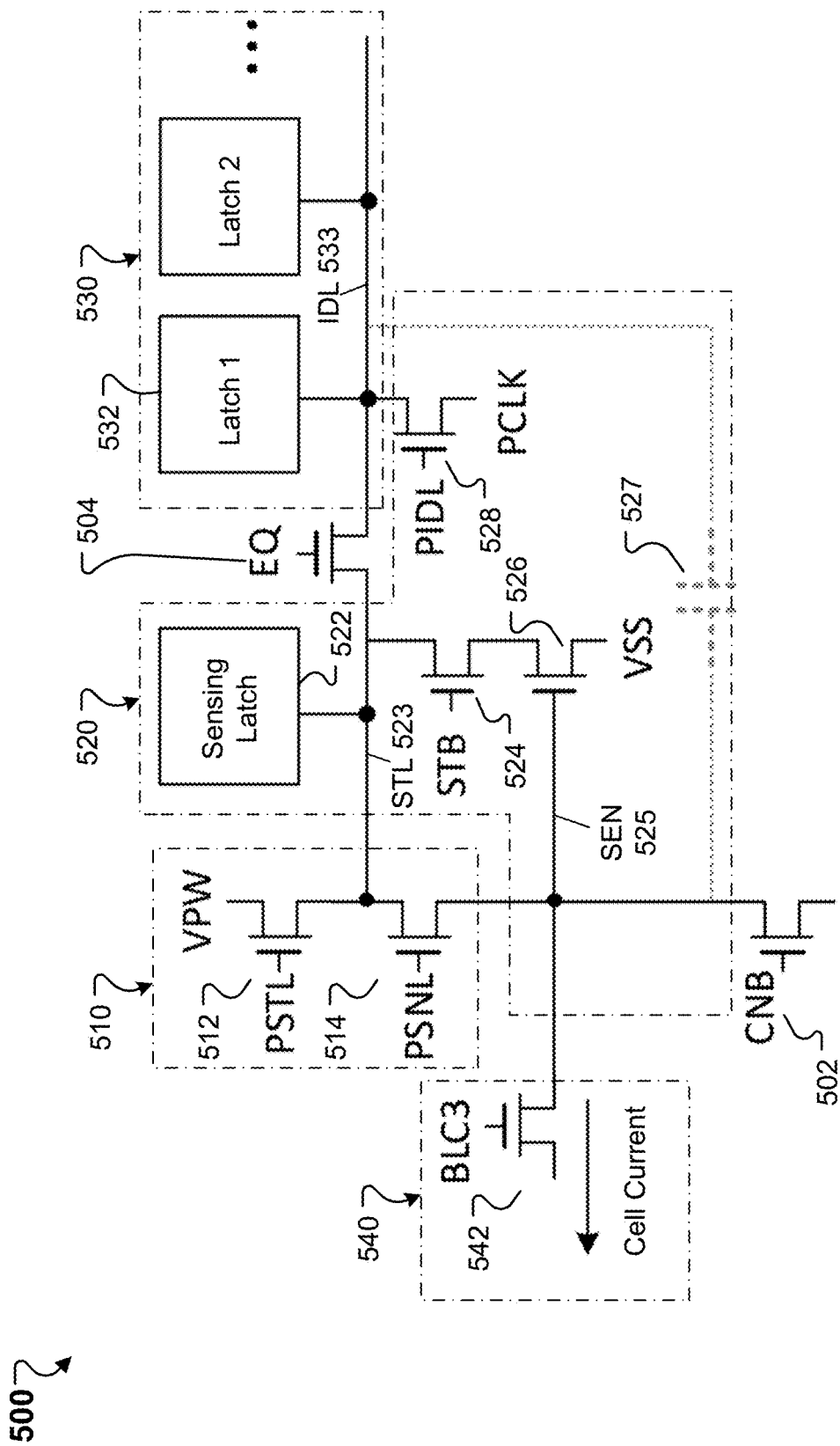
FIG. 5A shows a circuit diagram illustrating an example page buffer in a page buffer circuit.

As shown in FIG. 3A, the page buffer circuit 310 includes a number of page buffers PB_0 310-0, PB_1 310-1, . . . , PB_n, 310-n (referred to generally as page buffers 310 and individually as page buffer 310), where n is an integer. The page buffers 310 can be sequentially arranged along a direction, e.g., along a length of the page buffers as illustrated in FIG. 2B. Each page buffer 310 includes multiple conductive lines (e.g., metal lines) for connecting components (e.g., transistors) in the page buffer 310, e.g., as illustrated with further details in FIGS. 5A-5B. For example, each page buffer 310-0, 310-1, . . . , or 310-n can include a respective internal data-bus line (IDL) IDL-0 312-0, IDL-1 312-1, . . . , IDL-n 312-n (referred to generally as IDLs 312 and individually as IDL 312). The IDL 312 can be configured to connect a plurality of latches in the page buffer 310, e.g., as illustrated in FIG. 5A, for internal data operations/transfers, e.g., transferring data between latches and/or transferring data out to the CDL circuit 304.

As illustrated in FIG. 3A, each page buffer 310 can include a sensing node SEN_0 314-0, SEN_1 314-1, . . . , SEN_n 314-n (referred to generally as sensing nodes 314 and individually as sensing node 314). The sensing node 314 can be a conductive line, e.g., a metal line, in the page buffer 310. The sensing node 314 can be coupled to a bit line (e.g., the bit line as described in FIG. 1B or 1C, or the bit line 215 of FIGS. 2A-2B) for sensing data.

In some embodiments, as shown in FIG. 3A, the sensing node 314, e.g., SEN_0, SEN_1, . . . , SEN_n, in each page buffer 310 can be used as a partial data bus section DBUS-0, DBUS_1, . . . , DBUS_n (referred to generally as DBUSs 314 and individually as DBUS 314)). The series of data bus sections 314, e.g., DBUS_0, DBUS_1, . . . , DBUS_n, in the page buffer circuit 302 and DBUS 305 in the CDL circuit 304 can be connected together through a plurality of connection transistors 316-0, 316-1, . . . , 316-n (referred to generally as connection transistors 316 and individually as connection transistor 316) to form the data bus 306. The DBUS 305 can be a conductive line (e.g., a metal line) connected to multiple caches in the CDL circuit 304.

In some embodiments, the connection transistor 316 is included in a corresponding page buffer 310, e.g., as illustrated in FIG. 3A. For example, page buffer 310-0 includes connection transistor 316-0 coupled between the sensing node 314-0 and adjacent sensing node 314-1 in page buffer 310-1 subsequent to page buffer 310-0. In some embodiments, the connection transistor 316 is positioned between adjacent page buffers 310 but external to the adjacent page buffers 310.

Conductive lines (e.g., made of a metal material such as tungsten W) in the page buffer 310 can be insulated from one another by an insulating material (e.g., a dielectric material such as silicon oxide). In some embodiments, in the page buffer 310, the IDL 312 and the sensing node (or the DBUS section) 314 can be two parallel conductive lines (e.g., metal lines) and can be positioned adjacent to each other and separated from each other by the insulating material. In such a way, as illustrated in FIG. 3B, a parasitic capacitor 320 can be formed between the IDL 312 (e.g., IDL_i) and the sensing node (or the DBUS section) 314 (e.g., SEN_i or DBUS_i) in the page buffer 310, where i is 0, 1, . . . , n. If the IDL 312 and the sensing node (or the DBUS section) 314 are metal lines separated by a dielectric material, the formed parasitic capacitor 320 has a capacitance that can be used as a sensing capacitance. Accordingly, the parasitic capacitor 320 coupled to the sensing node 314 can function as a sensing capacitor that can be charged or discharged for data sensing as discussed with further details in FIGS. 6A-6E. Thus, the page buffer 310 can include the parasitic capacitor 320 for data sensing, without using any actual sensing capacitor.

Each connection transistor 316 has first and second terminals coupled to adjacent DBUS sections 314 and a gate terminal configured to receive a control signal CNB_0, CNB_1, . . . , CNB_n (referred to generally as control signals CNBs and individually as referred to control signal CNB). The connection transistor 316 can be turned on or off based on the control signal CNB, e.g., as described with further details in FIG. 7.

FIG. 3C illustrates an example normal operation mode of the integrated circuit 300 of FIG. 3A. In a normal operation (e.g., a read operation), the connection transistors 316 are turned off, and each DBUS section is used as a sensing node 314 for a corresponding page buffer 310. The sensing node 314 can have a sensing capacitance formed by a parasitic capacitor 320 defined between the DBUS section 314 and the IDL 312 in the corresponding page buffer 310. The normal operation can be described with further details in FIGS. 6A-6E.

FIG. 3D illustrates an example data transfer mode of the integrated circuit of FIG. 3A. In a data transfer operation, the connection transistors 316 are turned on, and the series of DBUS sections 314 and 305 are thus sequentially and conductively connected together as an integrated DBUS 306 to transfer data between page buffers 310 in the page buffer circuit 302 and caches in the CDL circuit 304. Each page buffer 310 can include an additional transistor, different from the connection transistor 316, that can be individually and optionally sequentially turned on to transfer data from the page buffer 310 to a corresponding cache in the CDL circuit 304 via the same integrated DBUS 306, e.g., as described with further details in FIGS. 8A-8B.

A whole DBUS section (e.g., DBUS section 314) in a page buffer (e.g., page buffer 310) can be used to form a parasitic capacitor with a sensing capacitance. However, in some regions of the page buffer (e.g., where a partial DBUS section is positioned adjacent to a bit line), coupling noise (e.g., between the bit line and the partial DBUS section) can occur.

Figure 4B:
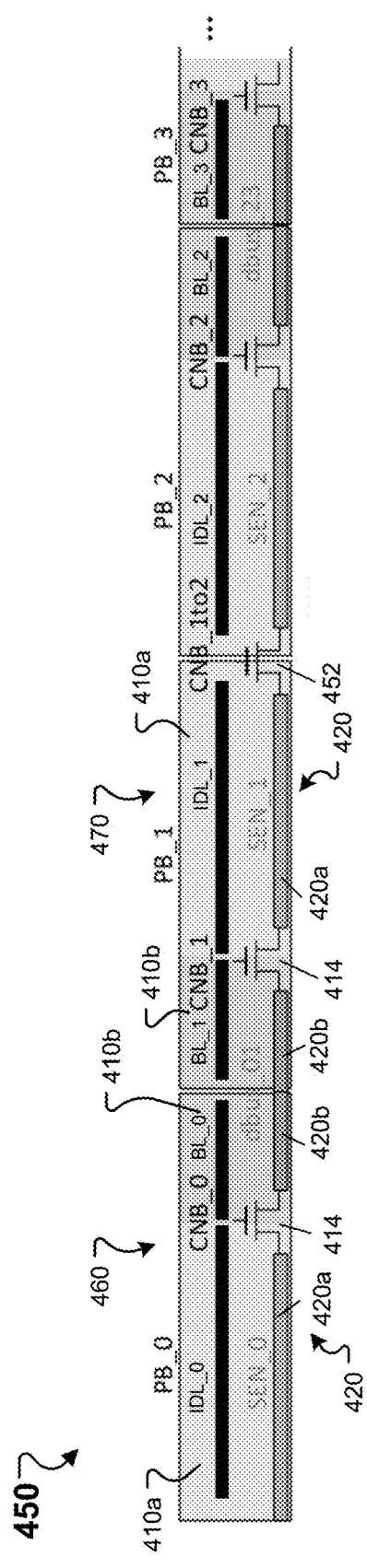
FIG. 4B illustrates an example page buffer circuit with a mirror page buffer placement.

In some embodiments, as illustrated in FIGS. 4A-4B, a page buffer 410 (e.g., PB_0) can be characterized to include at least two regions, including a non-coupling-noise region 410a and a coupling noise region 410b. A corresponding DBUS section 420 can be separated into at least two sub-sections, e.g., a non-coupling noise DBUS sub-section 420a in the non-coupling noise region 410a and a coupling noise DBUS sub-section 420b in the coupling noise region 410b.

In the non-coupling-noise region 410a, the non-coupling noise DBUS sub-section 420a can be used as a sensing node (e.g., SEN_0) for the page buffer 410. The non-coupling noise DBUS sub-section 420a can be positioned adjacent to an inner metal line (e.g., IDL_0 such as 312 of FIGS. 3A-3D) to form a corresponding parasitic capacitor (e.g., the parasitic capacitor 320 of FIG. 3B). In the coupling-noise region 410b, the coupling noise DBUS sub-section 420b may be positioned adjacent to another inner metal line (e.g., bit line BL_0), which may cause coupling noise. Thus, the coupling noise DBUS sub-section 420b is not suitable for forming a parasitic capacitor and can be used only as part of a data bus for data transfer (e.g., dbus_0).

In some embodiments, as illustrated in FIGS. 4A-4B, the page buffer 410 (e.g., PB_0) can include a second connection transistor (or a section transistor) 414 coupled between the non-coupling noise DBUS sub-section 420a and the coupling noise DBUS sub-section 420b. The second connection transistor 414 has first and second terminals separately coupled to the non-coupling noise DBUS sub-section 420a and the coupling noise DBUS sub-section 420b and a gate terminal for receiving a control signal (e.g., CNB_0_b) to turn on or off the second connection transistor 414. During a normal operation (e.g., as illustrated in FIG. 3C), the second connection transistor 414 is turned off such that the non-coupling noise DBUS sub-section 420a is used as the sensing node to form the parasitic capacitor for data sensing, while the coupling noise DBUS sub-section 420b is not used. During a data transfer operation (e.g., as illustrated in FIG. 3D), the second connection transistor 414 is turned on such that the non-coupling noise DBUS sub-section 420a and the coupling noise DBUS sub-section 420b are conductively connected to form an integrated DBUS section 420 for data transfer.

FIG. 4A illustrates an example page buffer circuit 400 with a sequence page buffer placement. The page buffer circuit 400 can be implemented as the page buffer circuit 220 of FIGS. 2A-2B or be the page buffer circuit 302 of FIGS. 3A-3D. The page buffer circuit 400 can include a plurality of page buffers 410, e.g., PB_0, PB_1, PB_2, PB_3. The page buffer 410 can be the page buffer 222 of FIG. 2B or the page buffer 310 of FIGS. 3A-3D. The page buffers 410 are sequentially arranged in the page buffer circuit 410.

Each page buffer 410, e.g., PB_0, PB_1, PB_2, PB_3, can have a same configuration, e.g., including a first connection transistor 412 and a second connection transistor 414. The second connection transistor 414 can be an intra-connector coupled between a non-coupling noise DBUS sub-section 420a and a coupling noise DBUS sub-section 420b in the page buffer 410. In contrast, the first connection transistor 412 can be an inter-connector coupled between two page buffers 410, e.g., between a coupling noise DBUS sub-section 420b of a preceding page buffer and the non-coupling noise DBUS sub-section 420a in a current page buffer. The first connection transistor 412 can be the connection transistor 316 of FIGS. 3A, 3C-3D, and can be configured to receive a control signal (e.g., CNB_0_a) for turning on or off the first connection transistor 412.

During a normal operation (e.g., as illustrated in FIG. 3C), both the first connection transistor 412 and the second connection transistor 414 in each page buffer 410 are turned off, such that the non-coupling noise DBUS sub-section 420a in each page buffer 410 is used as the sensing node to form the parasitic capacitor for data sensing. During a data transfer operation (e.g., as illustrated in FIG. 3D), both the first connection transistor 412 and the second connection transistor 414 in each page buffer 410 are turned on such that the non-coupling noise DBUS sub-section 420a and the coupling noise DBUS sub-section 420b are conductively connected to form an integrated DBUS section 420, and all the integrated DBUS sections 420 are conductively connected together to form an integrated DBUS (e.g., the data bus 240 of FIGS. 2A-2B or 306 of FIG. 3D) for data transfer.

FIG. 4B illustrates another example page buffer circuit 450 with a mirror page buffer placement. Different from the page buffer circuit 400 of FIG. 4A where each page buffer 410 has the same configuration and is sequentially arranged, the page buffer circuit 450 includes multiple pairs of first and second page buffers 460 and 470 (e.g., a first pair of PB_0 and PB_1, and a second pair of PB_2 and PB_3) that are arranged in the mirror page buffer placement.

Each of the first page buffer 460 and the second page buffer 470 can be similar to the page buffer 410 of FIG. 4A, and can include a second connection transistor 414 coupled between a non-coupling noise DBUS sub-section 420a and a coupling noise DBUS sub-section 420b in the page buffer 460 or 470. However, different from the page buffer circuit 400 of FIG. 4A, in the page buffer circuit 450, the coupling noise DBUS sub-sections 420b in adjacent page buffers (e.g., PB_0 and PB_1, or PB_2 and PB_3) in the same pair are conductively connected together or are a single continuous conductive line (e.g., dbus_01 or dbus_23). The non-coupling noise DBUS sub-section 420a (e.g., SEN_1) in the second page buffer 470 (e.g., PB_1) is coupled to a non-coupling noise DBUS sub-section (e.g., SEN_2) in a following page buffer (e.g., PB_2) in a following pair (e.g., PB_2 and PB_3) by a first connection transistor 452. Or the non-coupling noise DBUS sub-section 420a (e.g., SEN_2) in the first page buffer 470 (e.g., PB_2) is coupled to a non-coupling noise DBUS sub-section (e.g., SEN_1) in a preceding page buffer (e.g., PB_1) in a preceding pair by a first connection transistor 452. That is, adjacent pairs of first and second page buffers are coupled together using a corresponding first connection transistor 452.

The corresponding first connection transistor 452 can be positioned at a beginning of the first page buffer 460 (e.g., PB_2) in a pair or at an end of the second page buffer 470 (e.g., PB_1) in a pair, or between the adjacent pairs (e.g., between the first pair of PB_0 and PB_1 and the second pair of PB_2 and PB_3). The first connection transistor 452 can be similar to the connection transistor 316 of FIGS. 3A, 3C-3D or the connection transistor 412 of FIG. 4A, and can be configured to receive a control signal (e.g., CNB_1 to 2) for turning on or off the first connection transistor 452. In such a way, each pair in the mirror arrangement in the page buffer circuit 450 can include three transistors (two second connection transistors 414 and one first connection transistor 452). In contrast, two adjacent page buffers in the sequence arrangement in the page buffer circuit 400 of FIG. 4A have four transistors (two second connection transistors 414 and two first connection transistors 412). Thus, the page buffer circuit 450 can use less transistors than the page buffer circuit 400.

The page buffer circuit 450 can be operated similar to the page buffer circuit 400. During a normal operation (e.g., as illustrated in FIG. 3C), all the first connection transistors 452 and the second connection transistors 414 in the page buffer circuit 450 are turned off, such that the non-coupling noise DBUS sub-section 420a in each page buffer is used as the sensing node to form the parasitic capacitor for data sensing. During a data transfer operation (e.g., as illustrated in FIG. 3D), all the first connection transistors 452 and the second connection transistors 414 in the page buffer circuit 450 are turned on such that the non-coupling noise DBUS sub-section 420a and the coupling noise DBUS sub-section 420b are conductively connected to form an integrated DBUS section 420, and all the integrated DBUS sections 420 are conductively connected together to form an integrated DBUS (e.g., the data bus 240 of FIGS. 2A-2B or 306 of FIG. 3D) for data transfer.

Example Page Buffer

FIG. 5A is a circuit diagram illustrating an example page buffer 500 in a page buffer circuit. The page buffer circuit can be the page buffer circuit 220 of FIGS. 2A-2B, the page buffer circuit 302 of FIGS. 3A-3D, the page buffer circuit 400 of FIG. 4A, or the page buffer circuit 450 of FIG. 4B. The page buffer 500 can be the page buffer 222 of FIG. 2B, the page buffer 310 of FIGS. 3A-3D, the page buffer 410 of FIG. 4A, or the page buffer 460 or 470 of FIG. 4B. The page buffer 500 can be configured to have a parasitic capacitor (e.g., the parasitic capacitor 320 of FIG. 3B) and can implement voltage boosting for data sensing.

The page buffer 500 can include a connection transistor 502 that is configured to connect to an adjacent page buffer in the page buffer circuit, e.g., as described in FIGS. 3A, 3C-3D, 4A or 4B. The connection transistor 502 can be coupled between two DBUS sections (e.g., DBUS section 314 of FIG. 3A, 3C or 3D, 412 of FIG. 4A or 452 of FIG. 4B) in the page buffer 500 and the adjacent page buffer. The connection transistor 502 is configured to receive, at a gate terminal, a control signal CNB for turning off the connection transistor 502 during a normal operation mode (e.g., as illustrated in FIG. 3C) or turning on the connection transistor 502 during a data transfer mode (e.g., as illustrated in FIG. 3D).

In some embodiments, as shown in FIG. 5A, the page buffer 500 includes a precharging circuit 510, a sensing circuit 520, a storing latch circuit 530, and a bit line control circuit 540. The sensing circuit 520 is configured to sense data from a memory cell array (e.g., the memory cell array 210 of FIG. 2A). The storing latch circuit 530 is configured to store data from the sensing circuit 520 or output data to a cache data latch (CDL) circuit. The CDL circuit can be the CDL circuit 230 of FIG. 2A-2B, or the CDL circuit 304 of FIGS. 3A, 3C-3D. The storing latch circuit 530 can include a plurality of storing latches 532 that are individually coupled to an inter data-bus line (IDL) 533. The IDL 533 can be the IDL 312 of FIGS. 3A-3D, or IDL as described in FIGS. 4A-4B. The sensing circuit 520 and the storing latch circuit 530 can be connected through a latch transistor 504. The latch transistor 504 is configured to receive, at a gate terminal, a control signal EQ for turning on or off the latch transistor 504.

In some embodiments, the sensing circuit 520 includes a sensing latch 522, a first transistor 524, and a second transistor 526. The sensing latch 522 and the storing latch 532 can have a same configuration, e.g., as described with further details in FIG. 5B. The sensing latch 522 is coupled to a conductive line STL 523 that is coupled to the IDL 533 through the latch transistor 504. The first transistor 524 and the second transistor 526 are coupled in series between the conductive line STL 523 and a low supply voltage VSS. The first transistor 524 is configured to receive a strobe signal STB for turning on or off the first transistor 524. A gate terminal of the second transistor 526 is coupled to the bit line control circuit 540 by a conductive line 525 that can be considered as a sensing node SEN 525. The sensing node 525 is also coupled to the connection transistor 502. As noted above, the sensing node 525 can be used as a DBUS section in the page buffer 500. The sensing node 525 can be positioned adjacent to the IDL 533 and isolated from the IDL 533 by an insulating material (e.g., a dielectric material) to form a parasitic capacitor 527 (e.g., the parasitic capacitor 320 of FIG. 3B) that can be used as a sensing capacitor for data sensing.

As shown in FIG. 5A, the precharging circuit 510 is coupled to the sensing node 525. The bit line control circuit 540 is configured to have a first control node coupled to a bit line (e.g., the bit line 215 of FIGS. 2A-2B) and a second control node coupled to the sensing node 525. As discussed with further details in FIG. 6A and FIG. 7 below, the precharging circuit 510 is configured to precharge the sensing node 525 during a precharging phase. The bit line control circuit 540 can be configured to precharge the bit line during the precharging phase and discharge the sensing node 525 during a developing (or discharging) phase after the precharging phase. The bit line control circuit 540 can include at least one transistor 542 configured to receive a control signal BLC3 for turning on or off the transistor 542 for controlling a cell current flow.

The precharging circuit 510 can include two transistors 512 and 514 (e.g., PMOS transistors) coupled in series between a supply voltage VPW and the sensing node 525. The transistor 512 has a first terminal for receiving the supply voltage VPW, a gate terminal for receiving a precharging control signal PSTL. The transistor 514 has a gate terminal for receiving a precharging enable signal PSNL, a first terminal coupled to a second terminal of the transistor 512, and a second terminal coupled to the sensing node 525. The sensing latch 522 can be coupled to the first terminal of the transistor 514 by the conductive line STL 523, such that the transistor 514 can be used as a switch for individually or sequentially transferring data from the storing latch circuit 530, e.g., as discussed with further details in FIGS. 8A-8B.

In some embodiments, the page buffer 500 includes a boosting circuit that can include a boosting transistor 528, e.g., an n-channel transistor such as NMOS transistor. The boosting transistor 528 has a first terminal coupled to the IDL 533, a gate terminal for receiving a control signal PIDL, and a second terminal coupled to a boosting signal PCLK. As discussed with further details in FIGS. 6B, 6D, and 7, a voltage level of the IDL 533 can be controlled based on a voltage level of the boosting signal PCLK.

Figure 5B:
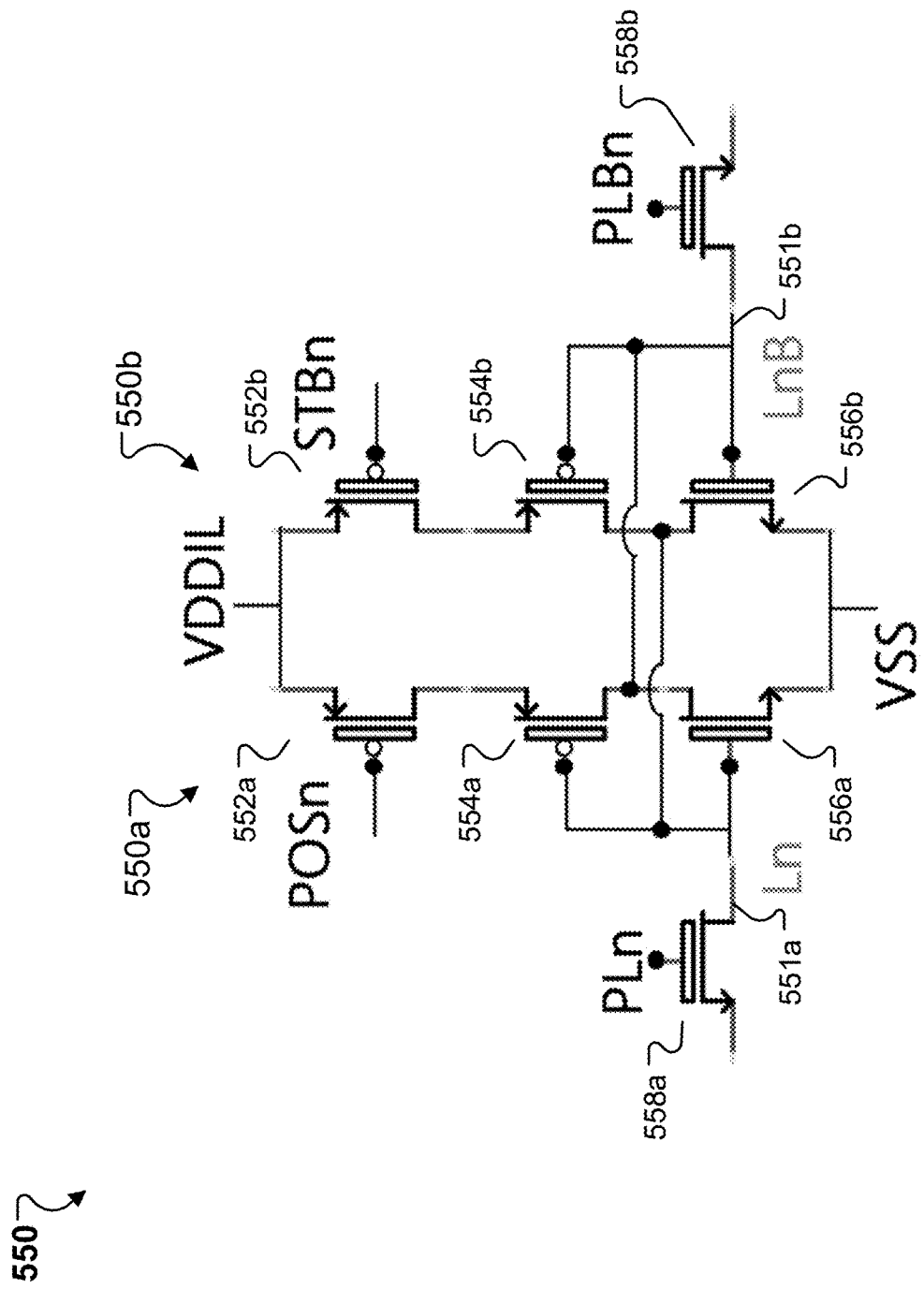
FIG. 5B shows a circuit diagram illustrating an example latch in a page buffer.

FIG. 5B shows a circuit diagram illustrating an example latch 550 in a page buffer (e.g., the page buffer 500 of FIG. 5A). The latch 550 can be the sensing latch 522 or the storing latch 532 of FIG. 5A. The latch 550 can be a tri-state latch or a fighting latch.

In some embodiments, as illustrated in FIG. 5B, the latch 550 is a tri-sate latch and can include a first side 550a and a second side 550b that are symmetric to each other. The first side 550a and the second side 550b are configured to receive a higher supply voltage VDDIL at one end and a lower supply voltage VSS at the other end. The first side 550a can include a first inverted p-type transistor 552a, a second inverted p-type transistor 554a, a first n-type transistor 556a, and a second n-type transistor 558a. The second side 550b can include a first inverted p-type transistor 552b, a second inverted p-type transistor 554b, a first n-type transistor 556b, and a second n-type transistor 558b.

For the first side 550a, the first inverted p-type transistor 552a includes a first terminal for receiving the higher supply voltage VDDIL, a second terminal coupled to the second inverted p-type transistor 554a, and a gate terminal for receiving a control signal POSn. The second inverted p-type transistor 554a includes a first terminal coupled to the second terminal of the first inverted p-type transistor 552a, a second terminal coupled to the first n-type transistor 556a and also to a gate terminal of the first n-type transistor 556b in the second side 550b, and a gate terminal coupled to a gate terminal of the first n-type transistor 556a and the second n-type transistor 558a. The first n-type transistor 556a includes a first terminal coupled to the second terminal of the second inverted p-type transistor 554a, a second terminal coupled to the lower supply voltage VSS, and the gate terminal to the gate terminal of the second inverted p-type transistor 554a and also to a node between the transistors 554b, 556b in the second side 550b. The second n-type transistor 558a includes a first terminal coupled to the gate terminal of the first n-type transistor 556a, a second terminal coupled out to a data bus line (e.g., IDL), and a gate terminal for receiving a control signal PLn.

The second side 550b has a symmetric configuration as the first side 550a. The first inverted p-type transistor 552b includes a first terminal for receiving the higher supply voltage VDDIL, a second terminal coupled to the second inverted p-type transistor 554b, and a gate terminal for receiving a control signal STBn. The second inverted p-type transistor 554b includes a first terminal coupled to the second terminal of the first inverted p-type transistor 552b, a second terminal coupled to the first n-type transistor 556b and also to a gate terminal of the first n-type transistor 556a in the first side 550a, and a gate terminal coupled to a gate terminal of the first n-type transistor 556b and the second n-type transistor 558b. The first n-type transistor 556b includes a first terminal coupled to the second terminal of the second inverted p-type transistor 554b, a second terminal coupled to the lower supply voltage VSS, and the gate terminal to the gate terminal of the second inverted p-type transistor 554b and also to a node between the transistors 554a, 556a in the first side 550a. The second n-type transistor 558b includes a first terminal coupled to the gate terminal of the first n-type transistor 556b, a second terminal coupled out to the data bus line (e.g., IDL), and a gate terminal for receiving a control signal PLBn.

A value corresponding to a voltage at LnB node 551b coupled between the transistors 554b, 556b, 558b in the second side 550b is opposite to a value corresponding to a voltage at Ln node 551a coupled between the transistors 554a, 556a, 558a in the first side 550a. The latch 550 can be configured to store data by updating the value at the LnB node 551b and/or the value at the Ln node 551a.

Example Operations

FIGS. 6A-6E show example circuit diagrams of the page buffer 500 of FIG. 5A in different operation phases of a normal operation (e.g., a read operation). FIG. 7 shows a timing diagram 700 illustrating voltage changes at different nodes of the page buffer 500 during the operation phases of FIGS. 6A-6E, including precharging phase 702, boosting up phase 704, developing phase 706, boosting down phase 708, and data strobe phase 710.

As noted above, the connection transistor 502 can be turned off by the control signal CNB during the normal operation such that the parasitic capacitor 527 is formed between the sensing node 525 and the IDL 533 for the normal operation. The latch transistor 504 can be also turned off by the control signal EQ during the normal operation such that no data transfer between the sensing circuit 520 and the storing latch circuit 530.

During the precharging phase, as circuit diagram 600 of FIG. 6A and the precharging phase 702 of FIG. 7 show, the transistors 512 and 514 are turned on by receiving corresponding PSTL and PSNL signals (e.g. at a high voltage level). Accordingly, the pre-charging circuit 510 is turned on to precharge the sensing node 525 from a lower voltage level to a higher voltage level. The sensing node 525 can be precharged by the supply voltage VPW via the transistors 512 and 514 along a current path 602.

During the precharging phase, the transistor 542 is turned off by a corresponding control signal BLC3 such that the bit line is conductively disconnected to the sensing node 525 and can be independently precharged by the bit line control circuit 540. During the precharging phase, the boosting transistor 528 is turned on by the corresponding control signal PIDL (e.g., at a high voltage level) and receives the PCLK signal at a low voltage level VSS, such that a current path 604 flows from the IDL 533 to the second terminal of the boosting transistor 528 to cause the IDL 533 to be at a low voltage level VSS, as shown in FIG. 7. Thus, the parasitic capacitor 527 is precharged to have a sensing capacitance or a sensing voltage between the sensing node 525 at a high voltage level and the IDL 533 at a low voltage level VSS.

To overcome a voltage gap between a bit line operation bias and a sensing (or strobing) bias, the boosting up phase 704 and the boosting down phase 708 are performed respectively before and after the developing phase 706.

During the boosting up phase, as circuit diagram 610 of FIG. 6B and the boosting up phase 704 of FIG. 7 show, the boosting transistor 528 receives the PCLK signal with an increasing boosting level, which charges the IDL 533 to a high voltage level along a current path 612. As the sensing voltage between the sensing node 525 and the IDL 533 remains, a voltage level of the sensing node 525 can be boosted up by a voltage increase of the IDL 533 from the low voltage level VSS to a sensing voltage with a high voltage level, as illustrated in FIG. 7. Note that, during the boosting up phase, the transistors 512, 514, 542, 524 are turned off by corresponding signals.

During the development phase (or a discharging phase), as circuit diagram 620 of FIG. 6C and the development phase 706 of FIG. 7 show, the precharging circuit 510 is turned off and the sensing node 525 is no longer charged by the precharging circuit 510. Instead, the transistor 542 is turned on by receiving an enable signal BLC3 (e.g., a high voltage level) at its gate terminal, and the sensing node 525 is conductively connected to the bit line. Accordingly, the sensing voltage at the sensing node 525 can be discharged by providing a sensing current (or a cell current) to the bit line via the transistor 542 (or the bit line control circuit 540) along a current path 622. When a memory cell coupled to the bit line has a high threshold voltage, e.g., high vt case as shown by curve 720 in FIG. 7, no current path is formed and the sensing voltage remains unchanged, which can correspond to a bit stored in the memory cell. When the memory cell coupled to the bit line has a low threshold voltage, e.g., low vt case as shown by curve 722 in FIG. 7, the current path 622 forms and the sensing voltage is discharged to a low voltage level corresponding to a bit stored in the memory cell. During the development phase, as shown in FIGS. 6C and 7, the PCLK signal is kept at the boosting level, such that the voltage level at the sensing node 525 also changes at the boosting level.

To accurately sense the bit stored in the memory cell, the voltage level at the sensing node 525 needs to be boosted down. During the boosting down phase, e.g., as shown in circuit diagram 630 of FIG. 6D and the boosting down phase 708 of FIG. 7, the transistor 542 is turned off such that the sensing node 525 is separated from the bit line and is no longer discharged. Similarly, the precharging circuit 510 is also turned off so that the sensing node 525 is not charged by the precharging circuit 510. Instead, the PCLK signal is decreased to a low voltage level Vss, same as the voltage level before the boosting up phase, such that a current path 632 is formed from the IDL 533 to the second terminal of the boosting transistor 528 and the voltage level at the IDL 533 is decreased. As the sensing voltage between the sensing node 525 and the IDL 533 remains, a voltage level of the sensing node 525 can be boosted down by a voltage decrease of the IDL 533, as illustrated in FIG. 7.

Figure 6E:
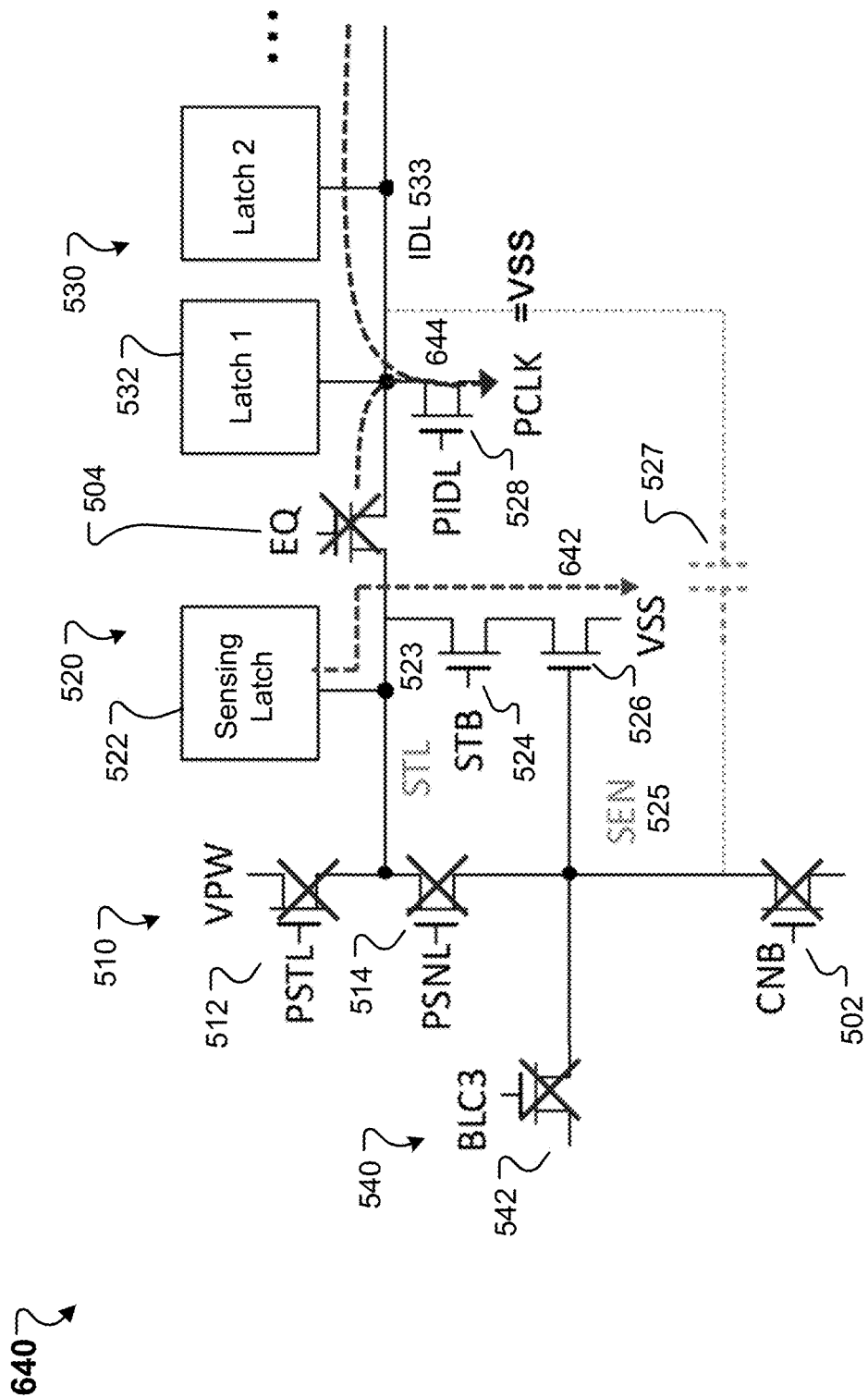
Figure 7:
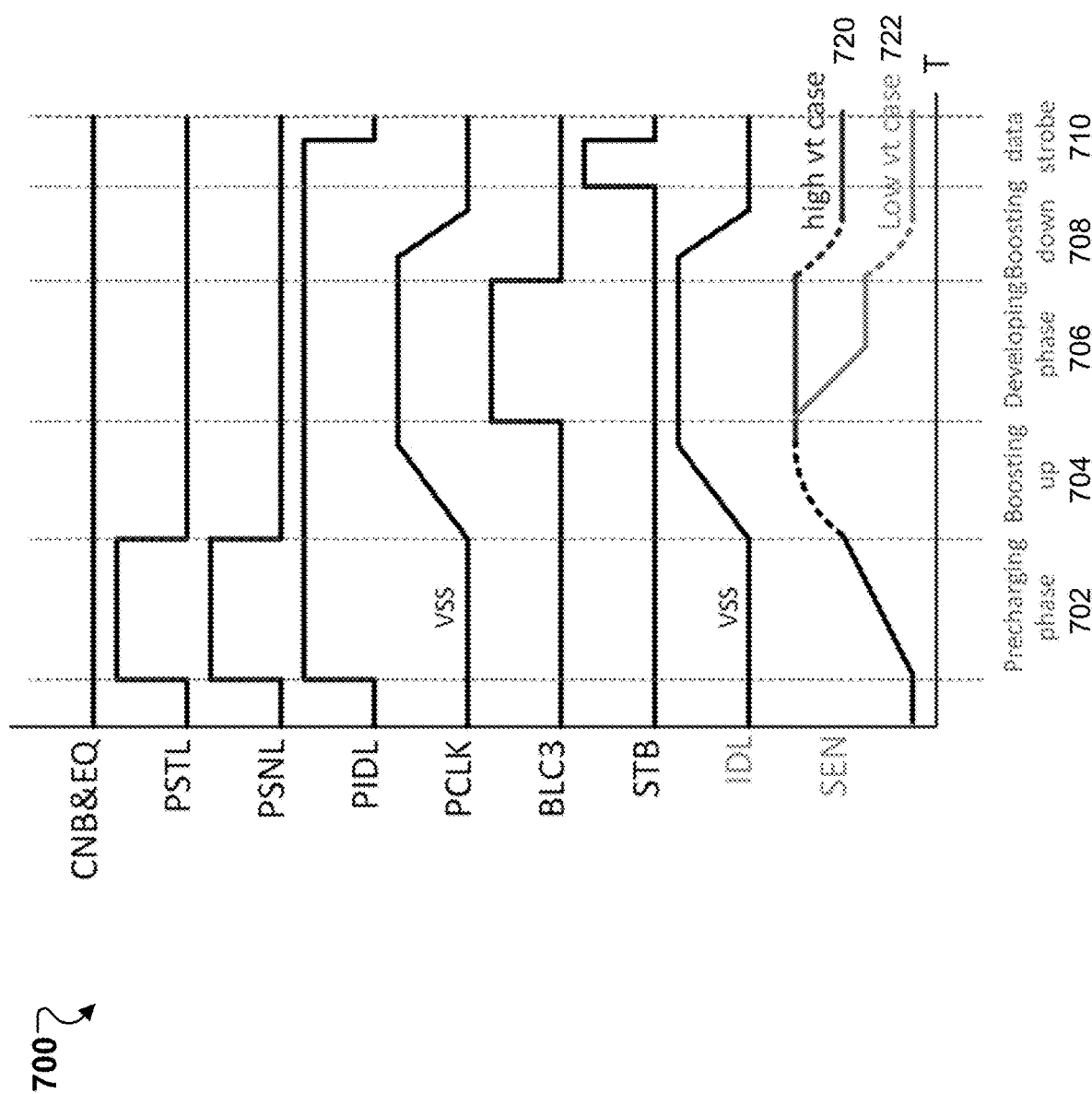
FIG. 7 shows a timing diagram illustrating voltage changes at different nodes of the page buffer during the operation phases of FIGS. 6A-6E.

During the data strobing phase, e.g., as shown in circuit diagram 640 of FIG. 6E and the data strobing phase 710 of FIG. 7, the first transistor 524 is turned on by a strobe signal STB, and a current path 642 is formed from the sensing latch 522 to the low voltage level VSS at the second terminal of the second transistor 526, such that the voltage level of the sensing node 525 that corresponds to a bit stored in the memory cell can be strobed to the sensing latch 522.

For example, transistor 558*a* in the sensing latch 522 is coupled to the STL node 523, and node Ln 551*a* in the sensing latch 522 can have a high voltage level corresponding to bit "0". If the memory cell (e.g., SLC), stores bit "0" that corresponds to a high threshold voltage, the voltage level of the sensing node 525 remains at a high voltage level after the development phase and the boosting down phase. Accordingly, the voltage level at node Ln 551*a* of the sensing latch 522 remains at the high voltage level, corresponding to bit "0". If the memory cell (e.g., SLC) stores bit "1" that corresponds to a low threshold voltage, the voltage level of the sensing node 525 becomes a low voltage level after the development phase and the boosting down phase. Accordingly, a voltage level at node Ln 551*a* of the sensing latch 522 can become a low voltage level, corresponding to bit "1".

During the data strobing phase, the precharging circuit 510 and the bit line control circuit 540 are both turned off. The IDL 533 is maintained at the low voltage level VSS through a current path 644. Once the voltage level of the sensing node 525 is strobed to the sensing latch 522, the first transistor 524 can be turned off by the STB signal and the boosting transistor 528 can be also turned off by the PIDL signal.

After the data strobing phase, the latch transistor 504 can be turned on by EQ signal, such that data stored in the sensing latch 522 can be transferred to a corresponding latch 532 in the storing latch circuit 530 through the IDL 533. Further, as described with further details in FIGS. 8A-8B, data latched in the storing latch circuit 530 can be transferred out to a cache data latch (CDL) circuit by turning on the latch transistor 504, the transistor 514, and the connection transistor 502 in the page buffer 500.

Figure 8A:
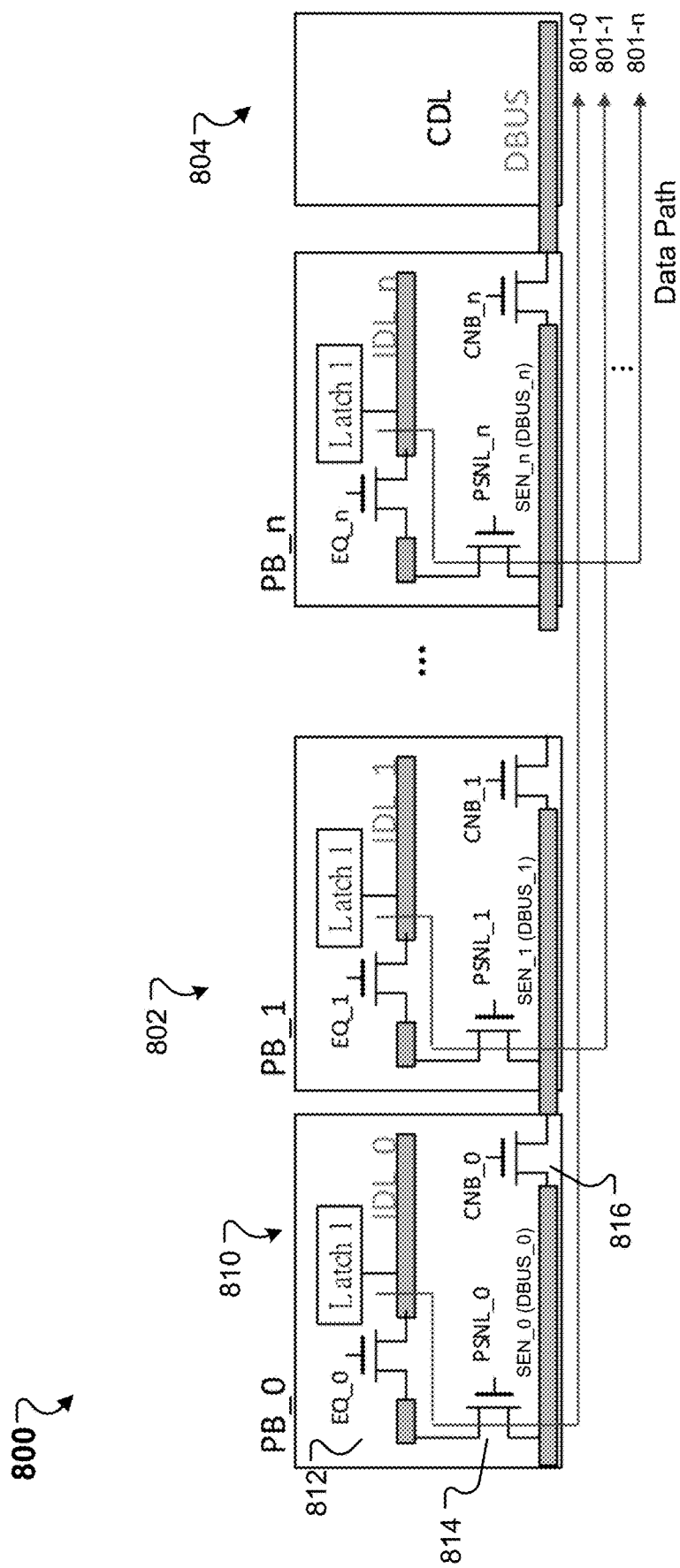
FIG. 8A illustrates an example data transfer between a page buffer circuit and a cache data latch (CDL) circuit.
Figure 8B:
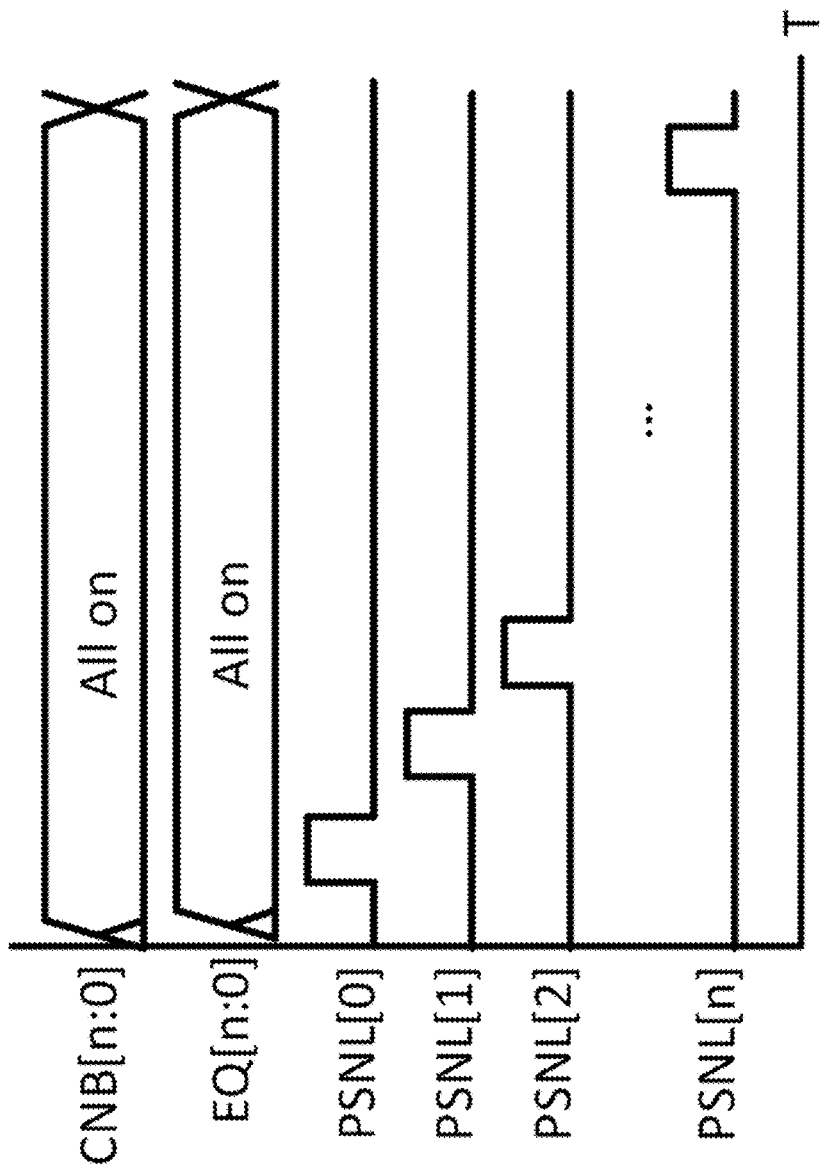
FIG. 8B shows a timing diagram illustrating voltage changes at different nodes of the page buffer circuit during the data transfer of FIG. 8A.

FIG. 8A illustrates an example data transfer 800 between a page buffer circuit 802 and a cache data latch (CDL) circuit 804. FIG. 8B shows a timing diagram illustrating voltage changes at different nodes of the page buffer circuit 802 during the data transfer of FIG. 8A. The page buffer circuit 802 can be the page buffer circuit 220 of FIGS. 2A-2B, the page buffer circuit 302 of FIGS. 3A-3D, the page buffer circuit 400 of FIG. 4A, or the page buffer circuit 450 of FIG. 4B. The CDL circuit 804 can be the CDL circuit 230 of FIG. 2A-2B, or the CDL circuit 304 of FIGS. 3A, 3C-3D. The page buffer circuit 802 includes a number of page buffers 810, e.g., PB_0, PB_1, . . . , PB_n. Each page buffer 810 can be the page buffer 222 of FIG. 2B, the page buffer 310 of FIGS. 3A-3D, the page buffer 410 of FIG. 4A, the page buffer 460 or 470 of FIG. 4B, or the page buffer 500 of FIGS. 5A-5B and FIGS. 6A-6E. Each page buffer 810 can have a same configuration. As an example, the structure of PB_0 is labelled in FIG. 8A.

Similar to FIG. 3D, in a data transfer operation, as shown in FIG. 8B, all the connection transistors 816 (e.g., the connection transistor 316 of FIG. 3D or 502 of FIG. 5A) are turned on by corresponding CNB signals CNB [n:0] such that the series of DBUS sections, e.g., DBUS_0, DBUS_1, . . . , DBUS_n, are conductively connected together to form an integrated DBUS (e.g., the DBUS 306 of FIG. 3D). In each page buffer 810, a latch transistor 812 (e.g., the latch transistor 504 of FIG. 5A) is turned on by a corresponding EQ signal during the data transfer operation. To ensure data in latches of the page buffers 810 to be transferred to corresponding caches in the CDL circuit 804 through the integrated DBUS, a second transistor 814 (e.g., the transistor 514 of FIG. 5A) in each page buffer 810 is sequentially turned on by a corresponding PSNL signal, e.g., PSNL_0, PSNL_1, . . . , PSNL_n, as shown in FIG. 8B. Accordingly, a respective data path 801-0 for PB_0, 801-1 for PB_1, . . . , 801-*n* for PB_n (referred to generally as data paths 801 and individually as data path 801) forms, and data in a latch of each page buffer 810 can be transferred to a corresponding cache in the CDL circuit 804. In some examples, data latched in a particular page buffer in the page buffer circuit 802 can be transferred to the CDL circuit 804 through the integrated DBUS along a data path 801 by turning on the transistor 814 in the particular page buffer while turning off transistors 814 in all the other page buffers in the page buffer circuit 802.

Example Process

Figure 9:
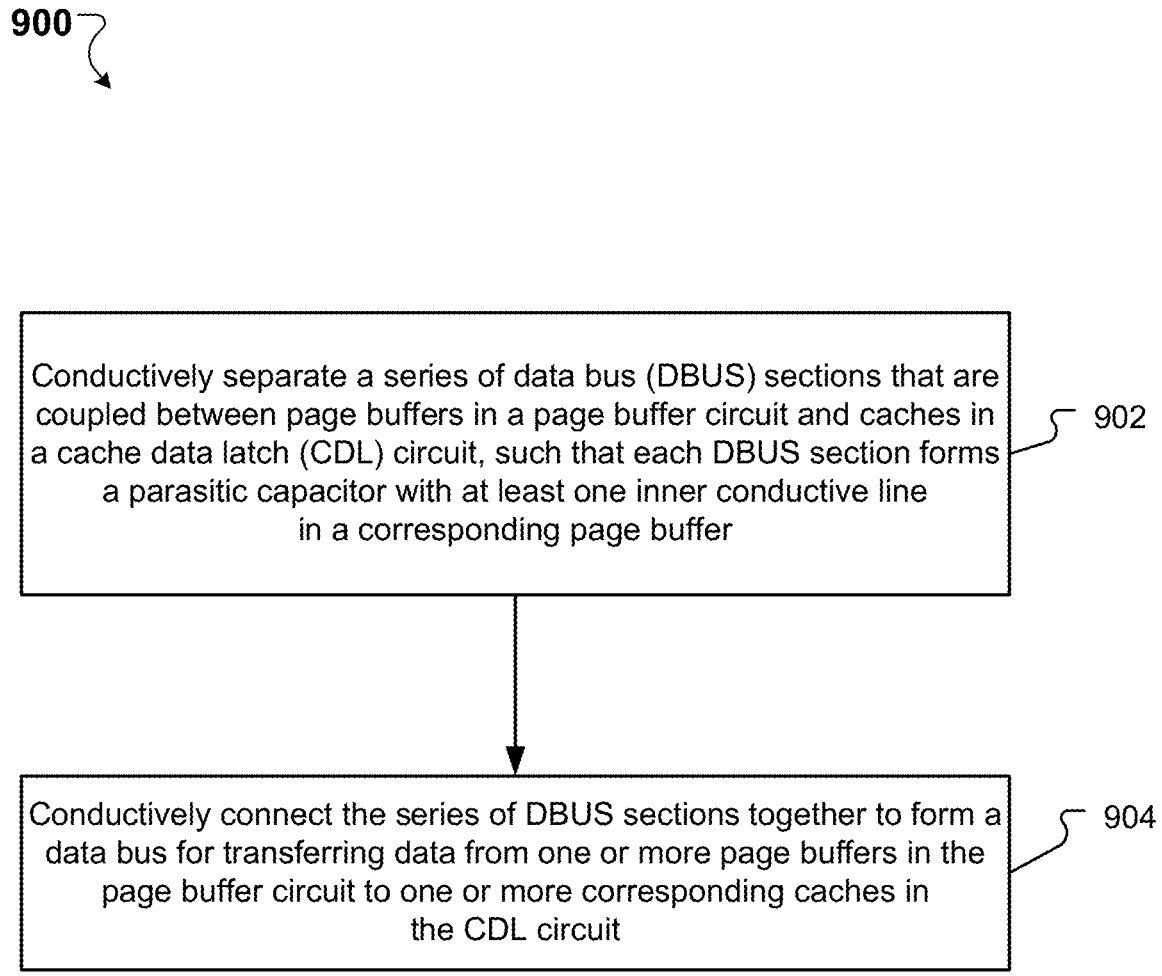
FIG. 9 is a flow chart of an example process for managing a page buffer circuit in a memory device, according to one or more implementations of the present disclosure.

FIG. 9 illustrates an example of a process 900 for managing a page buffer circuit in a memory device, according to one or more implementations of the present disclosure. The page buffer circuit can be coupled to a cache data latch (CDL) circuit using a plurality of data bus (DBUS) sections that can be conductively connected together during a data transfer operation and can be separated from one another during a normal operation. The process 900 can be performed by the memory device.

The memory device can be the memory device 116 of FIG. 1A or the memory device 200 of FIG. 2A. The memory device can include a memory cell array (e.g., the memory cell array 210 of FIG. 2A) having a number of memory cells (e.g., memory cells 141 of FIG. 1B or 157 of FIG. 1C). The page buffer circuit can be the page buffer circuit 220 of FIGS. 2A-2B, the page buffer circuit 302 of FIGS. 3A-3D, the page buffer circuit 400 of FIG. 4A, or the page buffer circuit 450 of FIG. 4B, or the page buffer circuit 802 of FIG. 8A. The CDL circuit can be the CDL circuit 230 of FIG. 2A-2B, or the CDL circuit 304 of FIGS. 3A, 3C-3D, or the CDL circuit 804 of FIG. 8A. The CDL circuit can include a number of caches.

The page buffer circuit can include a number of page buffers. Each page buffer can be the page buffer 222 of FIG. 2B, the page buffer 310 of FIGS. 3A-3D, the page buffer 410 of FIG. 4A, the page buffer 460 or 470 of FIG. 4B, the page buffer 500 of FIGS. 5A-5B and FIGS. 6A-6E, or the page buffer 810 of FIG. 8A. Each of the plurality of DBUS sections can be the DBUS section 314 of FIGS. 3A-3D or 420 of FIGS. 4A-4B.

In some embodiments, the memory device further includes a plurality of bit lines (e.g., the bit lines 215 of FIG. 2A-2B) coupled between the memory cell array and the page buffer circuit. Each page buffer of the plurality of page buffers can be conductively coupled to a corresponding memory cell in the memory cell array through a respective bit line of the plurality of bit lines.

At 902, the plurality of data bus (DBUS) sections are conductively separated from one another, such that each data bus section forms a parasitic capacitor with at least one inner conductive line in a respective page buffer, e.g., for data sensing as illustrated in FIG. 3C.

In some embodiments, the memory device can perform a read operation, e.g., in response to receiving a read command from a controller such as the device controller 112 or the host controller 122 of FIG. 1A. The read command can be for reading data from the memory cell array from the page buffer circuit. The memory device can separate the plurality of DBUS sections in response to receiving the read command.

In some embodiments, each page buffer in the page buffer circuit includes a plurality of latches (e.g., latch 532 of FIG. 5A or 550 of FIG. 5B) each conductively coupled to an inner data-bus line (IDL) (e.g., the IDL 312 of FIGS. 3A-3D, the IDL of FIGS. 4A-4B, the IDL 533 of FIG. 5A) in the page buffer. The IDL in the page buffer is configured to form the parasitic capacitor (e.g., the parasitic capacitor 320 of FIG. 3B) with a corresponding DBUS section for the page buffer. The IDL can be positioned adjacent to and parallel to the corresponding DBUS section and conductively separated by an insulating material. Inner conductive lines in the plurality of page buffers and the plurality of DBUS sections can be formed in a layer adjacent to the memory cell array.

In some embodiments, for a page buffer in the page buffer circuit, the process 900 further includes: precharging a corresponding parasitic capacitor formed by a corresponding data bus section and a corresponding inner conductive line in the page buffer (e.g., as illustrated in FIG. 6A and FIG. 7), discharging a sensing voltage at the corresponding data bus section by conductively connecting the corresponding data bus section to a memory cell through a corresponding bit line (e.g., as illustrated in FIG. 6C and FIG. 7), and strobing a sensing result corresponding to data in the memory cell to a latch of the page buffer (e.g., as illustrated in FIG. 6E and FIG. 7).

In some embodiments, the process 900 further includes: after precharging the corresponding parasitic capacitor and before discharging the sensing voltage at the corresponding data bus section, boosting up the voltage level at the corresponding data bus section by increasing a voltage level at the corresponding inner conductive line (e.g., as illustrated in FIG. 6B and FIG. 7), and after discharging the sensing voltage at the corresponding data bus section and before strobing the sensing result, boosting down the discharged sensing voltage at the corresponding data bus section by decreasing the voltage level at the corresponding inner conductive line (e.g., as illustrated in FIG. 6D and FIG. 7).

In some embodiments, each page buffer in the page buffer circuit includes a boosting transistor (e.g., the boosting transistor 528 of FIG. 5A) having: a first terminal coupled to the IDL, a second terminal configured to receive a boosting signal (e.g., PCLK signal), and a gate terminal configured to receive a control signal (e.g., PIDL signal) to turn on or off the boosting transistor. The boosting transistor can be configured to be turned on such that a voltage level of the IDL is controlled based on a voltage level of the boosting signal (e.g., as illustrated in FIGS. 6B, 6D and FIG. 7).

At 904, the plurality of data bus sections are conductively connected together to form a data bus for transferring data from one or more page buffers in the page buffer circuit to one or more corresponding caches in the CDL circuit. The data bus can be the data bus 240 of FIGS. 2A-2B, or the data bus 306 of FIG. 3D.

In some embodiments, the memory device performs a data transfer operation, e.g., in response to receiving a data transfer command for transferring the data from the one or more page buffers in the page buffer circuit to the one or more corresponding caches in the CDL circuit. The memory device can conductively connect the plurality of data bus sections to form the data bus in response to receiving the data transfer command.

In some embodiments, the memory device includes a plurality of connection transistors (e.g., the connection transistors 316 of FIGS. 3A, 3C-3D, 414 of FIG. 4A or 4B, 816 of FIG. 8A) coupled between adjacent DBUS sections in the plurality of DBUS sections. The plurality of connection transistors can be configured to: be turned on to conductively connect the plurality of DBUS sections together to form the data bus, and be turned off to conductively separate the plurality of DBUS sections from each other, such that each DBUS section functions as a sensing node in the respective page buffer to form the parasitic capacitor with the at least one inner conductive line in the respective page buffer.

In some embodiments, each connection transistor of the plurality of connection transistors is coupled between two adjacent DBUS sections and arranged between adjacent page buffers corresponding to the two adjacent DBUS sections.

In some embodiments, each page buffer of the plurality of page buffers includes: a respective connection transistor of the plurality of connection transistors, and a respective DBUS section of the plurality of DBUS sections. The respective connection transistor has a first terminal coupled to the respective DBUS section of the page buffer, a second terminal coupled to an adjacent DBUS section of an adjacent page buffer, and a gate terminal configured to receive a control signal (e.g., CNB signal of FIGS. 3A, 3C-3D, FIG. 7 or FIGS. 8A-8B) for turning on or off the respective connection transistor.

In some embodiments, each page buffer of the plurality of page buffers includes: a respective DBUS section having a first sub-section and a second sub-section, and a respective second connection transistor (or section transistor) (e.g., transistor 414 of FIG. 4A or 4B) coupled between the first sub-section and the second sub-section. The respective second connection transistor is configured to: be turned on to conductively connect the first sub-section and the second sub-section to form the respective DBUS section such that the plurality of DBUS sections are configured to be conductively connected together as the data bus, and be turned off to conductively separate the first sub-section and the second sub-section such that the first sub-section forms the parasitic capacitor with a corresponding inner conductive line in the page buffer.

The first sub-section can be a non-coupling-noise sub-section, and the second sub-section can be a coupling-noise sub-section. In some cases, the first sub-section of the respective DBUS section is positioned adjacent to an inner data-bus line (IDL) in the page buffer, and the second sub-section of the respective DBUS section is positioned adjacent to a bit line through which the page buffer is coupled to the memory cell array.

In some embodiments, the plurality of page buffers comprise first and second page buffers sequentially arranged in the page buffer circuit, and a second sub-section of the first page buffer is coupled to a first sub-section of the second page buffer by a corresponding connection transistor of the plurality of connection transistors, e.g., as illustrated in FIG. 4A.

In some embodiments, the plurality of page buffers include first, second, and third page buffers arranged in order in the page buffer circuit, and second sub-sections of the first and second page buffers are conductively connected, and first sub-sections of the second and third page buffers are coupled through a corresponding connection transistor of the plurality of connection transistors, e.g., as illustrated in FIG. 4B. Each of the first and third page buffers can include no connection transistor, and the second page buffer can include the corresponding connection transistor. In some embodiments, the plurality of page buffers include multiple pairs of first and second page buffers arranged in order in the page buffer circuit, and second sub-sections of the first and second page buffers are conductively connected, and first subsections of the first and second page buffers are respectively coupled to first sub-sections of adjacent page buffers in adjacent pairs through corresponding connection transistors of the plurality of connection transistors.

In some embodiments, each page buffer of the plurality of page buffers further includes a respective second transistor (e.g., the transistor 514 of FIGS. 5A, 6A-6E, or the transistor 814 of FIG. 8A). The respective second transistor has: a first terminal coupled to one or more latches in the page buffer through the at least one inner conductive line, a second terminal coupled to the respective DBUS section, and a gate terminal coupled to receive a second control signal (e.g., PSNL signal of FIG. 7 or FIG. 8B) for turning on or off the respective second transistor. The respective second transistor can be configured to be turned on to couple the respective DBUS section to a supply voltage for precharging the parasitic capacitor of the page buffer while the plurality of connection transistors are turned off to conductively separate the plurality of DBUS sections, e.g., as illustrated in FIGS. 6A and 7. The process 900 can further include: turning on the particular transistor in the page buffer and turning off particular transistors in other page buffers in the page buffer circuit to transfer data latched in the page buffer to a corresponding cache in the CDL circuit through the data. The process 900 can include: sequentially turning on a corresponding particular transistor in each of the page buffers in the page buffer circuit to transfer data latched in the page buffer to a corresponding cache in the CDL circuit through the data bus, e.g., as illustrated in FIG. 8B).

In some embodiments, each page buffer in the page buffer circuit includes: a sensing latch (e.g., the sensing latch 522 of FIG. 5A) coupled to the memory cell array, and a latch transistor (e.g., the transistor 504 of FIG. 5A or 812 of FIG. 8A) coupled between the sensing latch and the IDL and configured to be turned on to conductively connect the sensing latch to the IDL or be turned off to separate the sensing latch from the IDL.

The disclosed and other examples can be implemented as one or more computer program products, for example, one or more modules of computer program instructions encoded on a computer readable medium for execution by, or to control the operation of, data processing apparatus. The computer readable medium can be a machine-readable storage device, a machine-readable storage substrate, a memory device, or a combination of one or more them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A system may encompass all apparatus, devices, and machines for processing data, including by way of example a programmable processor, a computer, or multiple processors or computers. A system can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a standalone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed for execution on one computer or on multiple computers that are located at one site or distributed across multiple sites and interconnected by a communications network.

The processes and logic flows described in this document can be performed by one or more programmable processors executing one or more computer programs to perform the functions described herein. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer can include a processor for performing instructions and one or more memory devices for storing instructions and data. Generally, a computer can also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data can include all forms of nonvolatile memory, media and memory devices, including by way of example semiconductor memory devices, e.g., EPROM, EEPROM, and flash memory devices; magnetic disks. The processor and the memory can be supplemented by, or incorporated in, special purpose logic circuitry.

While this document may describe many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination in some cases can be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:

1. A memory device, comprising:
a memory cell array comprising memory cells;
a page buffer circuit comprising a plurality of page buffers coupled to the memory cell array; and
a cache data latch (CDL) circuit comprising a plurality of caches coupled to the plurality of page buffers in the page buffer circuit through a plurality of data bus (DBUS) sections,
wherein the plurality of DBUS sections are configured to be conductively connected together as a data bus for data transfer, and
wherein each DBUS section of the plurality of DBUS sections corresponds to a page buffer of the plurality of page buffers and is configured to conductively separate from at least one adjacent DBUS section for data sensing in the memory cell array.

2. The memory device of claim 1, comprising a plurality of connection transistors coupled between adjacent DBUS sections in the plurality of DBUS sections,
wherein the plurality of connection transistors are configured to:
be turned on to conductively connect the plurality of DBUS sections together to form the data bus, and
be turned off to conductively separate the plurality of DBUS sections from each other.

3. The memory device of claim 2, wherein each page buffer of the plurality of page buffers comprises:
a first transistor configured to be a connection transistor corresponding to the page buffer, and
a DBUS section, and
wherein the first transistor has a first terminal coupled to the DBUS section of the page buffer, a second terminal coupled to an adjacent DBUS section of an adjacent page buffer, and a gate terminal configured to receive a control signal for turning on or off the first transistor.

4. The memory device of claim 3, wherein each page buffer of the plurality of page buffers further comprises a second transistor having: a first terminal coupled to one or more latches in the page buffer through a at least one inner conductive line, a second terminal coupled to the DBUS section, and a gate terminal coupled to receive a second control signal for turning on or off the second transistor, and
wherein the memory device is configured to:
turn on the plurality of connection transistors to conductively connect the plurality of DBUS sections to form the data bus, and
turn on a respective second transistor of a particular page buffer of the plurality of page buffers and turn off second transistors in other page buffers of the plurality of page buffers, such that data latched in the particular page buffer is transferred from the particular page buffer to a corresponding cache in the CDL circuit through the data bus.

5. The memory device of claim 4, wherein the DBUS section is configured to conductively separate from the adjacent DBUS section and to form a parasitic capacitor with the at least one inner conductive line of the page buffer, and
wherein the second transistor is configured to be turned on to couple the DBUS section to a supply voltage for precharging the parasitic capacitor while the plurality of connection transistors are turned off to conductively separate the plurality of DBUS sections.

6. The memory device of claim 2, wherein each page buffer of the plurality of page buffers comprises:
a DBUS section having a first sub-section and a second sub-section, and
a section transistor coupled between the first sub-section and the second sub-section, and
wherein the section transistor is configured to:
be turned on to conductively connect the first sub-section and the second sub-section to form the DBUS section such that the plurality of DBUS sections are configured to be conductively connected together as the data bus, and
be turned off to conductively separate the first sub-section and the second sub-section such that the first sub-section forms a parasitic capacitor with a corresponding inner conductive line in the page buffer.

7. The memory device of claim 6, wherein the plurality of page buffers comprise first and second page buffers sequentially arranged in the page buffer circuit, and
wherein a second sub-section of the first page buffer is coupled to a first sub-section of the second page buffer by a corresponding connection transistor of the plurality of connection transistors.

8. The memory device of claim 6, wherein the plurality of page buffers comprise first, second, and third page buffers arranged in order in the page buffer circuit, and
wherein second sub-sections of the first and second page buffers are conductively connected, and first sub-sections of the second and third page buffers are coupled through a corresponding connection transistor of the plurality of connection transistors.

9. The memory device of claim 1, wherein each page buffer in the page buffer circuit comprises a plurality of latches each conductively coupled to an inner data-bus line (IDL) in the page buffer, and
wherein the IDL in the page buffer is configured to form a parasitic capacitor with a corresponding DBUS section for the page buffer.

10. The memory device of claim 9, wherein the IDL is positioned adjacent to and parallel to the corresponding DBUS section and conductively separated by an insulating material.

11. The memory device of claim 9, wherein each page buffer in the page buffer circuit comprises:
a sensing latch coupled to the memory cell array, and
a latch transistor coupled between the sensing latch and the IDL and configured to be turned on to conductively connect the sensing latch to the IDL or be turned off to separate the sensing latch from the IDL.

12. The memory device of claim 9, wherein each page buffer in the page buffer circuit comprises a boosting transistor having: a first terminal coupled to the IDL, a second terminal configured to receive a boosting signal, and a gate terminal configured to receive a control signal to turn on or off the boosting transistor, and
wherein the boosting transistor is configured to be turned on such that a voltage level of the IDL is controlled based on a voltage level of the boosting signal.

13. A page buffer circuit comprising:
a plurality of page buffers; and
a plurality of data bus (DBUS) sections,
wherein the plurality of DBUS sections are configured to be conductively connected in serial together as a data bus, and
wherein each DBUS section in the plurality of DBUS sections corresponds to a page buffer of the plurality of page buffers, and is configured to conductively separate from at least one adjacent DBUS section.

14. The page buffer circuit of claim 13, comprising a plurality of connection transistors coupled between adjacent DBUS sections in the plurality of DBUS sections,
    wherein the plurality of connection transistors are configured to:
        be turned on to conductively connect the plurality of DBUS sections together to form the data bus, and
        be turned off to conductively separate the plurality of DBUS sections from each other.

15. The page buffer circuit of claim 14, wherein each page buffer of the plurality of page buffers comprises:
    a DBUS section,
    a first transistor configured to be a connection transistor corresponding to the page buffer, and
    a second transistor having: a first terminal coupled to one or more latches in the page buffer through a at least one inner conductive line, a second terminal coupled to the DBUS section, and a gate terminal coupled to receive a second control signal for turning on or off the second transistor,
    wherein the plurality of connection transistors are configured to be turned on to conductively connect the plurality of DBUS sections to form the data bus, and a particular second transistor of a particular page buffer in the plurality of page buffers is configured to be turned on and second transistors of other page buffers of the plurality of page buffers are configured to be turned off, such that data latched in the particular page buffer is transferred from the particular page buffer to a corresponding cache in a cache data latch (CDL) circuit through the data bus.

16. The page buffer circuit of claim 14, wherein each page buffer of the plurality of page buffers comprises:
    a DBUS section having a first sub-section and a second sub-section, and
    a section transistor coupled between the first sub-section and the second sub-section, and
    wherein the section transistor is configured to:
        be turned on to conductively connect the first sub-section and the second sub-section to form the DBUS section such that the plurality of DBUS sections are configured to be conductively connected together as the data bus, and
        be turned off to conductively separate the first sub-section and the second sub-section such that the first sub-section forms a parasitic capacitor with a corresponding inner conductive line in the page buffer.

17. The page buffer circuit of claim 13, wherein each page buffer of the plurality of page buffers comprises:
    a plurality of latches each conductively coupled to an inner data-bus line (IDL) in the page buffer, wherein the IDL in the page buffer is configured to form a parasitic capacitor with a corresponding DBUS section for the page buffer,
    a sensing latch, and
    a latch transistor coupled between the sensing latch and the IDL and configured to be turned on to conductively connect the sensing latch to the IDL or be turned off to separate the sensing latch from the IDL.

18. The page buffer circuit of claim 17, wherein each page buffer of the plurality of page buffers comprises a boosting transistor having: a first terminal coupled to the IDL, a second terminal configured to receive a boosting signal, and a gate terminal configured to receive a control signal to turn on or off the boosting transistor, and
    wherein the boosting transistor is configured to be turned on such that a voltage level of the IDL is associated with a voltage level of the boosting signal.

19. An integrated circuit comprising:
    a first circuit comprising a plurality of sub-circuits; and
    a second circuit coupled to the first circuit through a plurality of conductive sections,
    wherein the plurality of conductive sections are configured to be conductively connected in serial together as a conductive bus between the first circuit and the second circuit, and
    wherein each conductive section in the plurality of conductive sections corresponds to a sub-circuit in the first circuit, and is configured to conductively separate from at least one adjacent conductive section.

20. The integrated circuit of claim 19, wherein the first circuit comprises a page buffer circuit comprising a plurality of page buffers, each sub-circuit of the plurality of sub-circuits comprising a respective page buffer of the plurality of page buffers, and the second circuit comprises a cache data latch (CDL) circuit comprising a plurality of caches, and
    wherein the integrated circuit is configured to transfer data from a page buffer in the page buffer circuit to a corresponding cache in the CDL circuit through the conductive bus.

* * * * *

UNITED STATES PATENT AND TRADEMARK OFFICE
CERTIFICATE OF CORRECTION

PATENT NO. : 12,322,469 B2  
APPLICATION NO. : 18/150584  
DATED : June 3, 2025  
INVENTOR(S) : Ji-Yu Hung and E-Yuan Chang Page 1 of 1

It is certified that error appears in the above-identified patent and that said Letters Patent is hereby corrected as shown below:

In the Claims

Claim 4
Column 29, Lines 41-42, delete "a at least one inner conductive line" and replace with --at least one inner conductive line--.

Claim 15
Column 31, Lines 16-17, delete "a at least one inner conductive line" and replace with --at least one inner conductive line--.

Signed and Sealed this  
Twentieth Day of January, 2026

John A. Squires  
*Director of the United States Patent and Trademark Office*